US012787798B2

(12) United States Patent
Kang

(10) Patent No.: US 12,787,798 B2
(45) Date of Patent: Nov. 3, 2026

(54) METHOD OF FABRICATING SEMICONDUCTOR PACKAGE

(71) Applicant: SAMSUNG ELECTRONICS CO., LTD., Suwon-si (KR)

(72) Inventor: Junghoon Kang, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 353 days.

(21) Appl. No.: 18/415,116

(22) Filed: Jan. 17, 2024

(65) Prior Publication Data

US 2024/0429066 A1 Dec. 26, 2024

(30) Foreign Application Priority Data

Jun. 26, 2023 (KR) ........................ 10-2023-0082150

(51) Int. Cl.

*H10W 70/05* (2026.01)
*H10W 40/10* (2026.01)
*H10W 72/00* (2026.01)

(52) U.S. Cl.

CPC ......... *H10W 70/093* (2026.01); *H10W 40/10* (2026.01); *H10W 72/073* (2026.01)

(58) Field of Classification Search

CPC . H10W 70/093; H10W 40/10; H10W 72/073; H10W 72/30; H10W 70/095

See application file for complete search history.

(56) References Cited

U.S. PATENT DOCUMENTS 8,501,613 B2 * 8/2013 Lei ...................... H10W 72/012 257/E21.477
9,048,125 B2 * 6/2015 Paek ...................... H10P 72/74
9,659,878 B2 * 5/2017 Chen ...................... H10P 14/40
10,510,595 B2 * 12/2019 Wu ...................... H10W 20/063
11,114,310 B1 * 9/2021 Chen ...................... H10P 72/7402

(Continued)

FOREIGN PATENT DOCUMENTS

CN 102376687 A * 3/2012 ........ H10W 72/0198
CN 102867757 A * 1/2013 ............ H10W 72/90

(Continued)

OTHER PUBLICATIONS

Delmdahl et al., "Advanced circuit packaging with excimer lasers," Industrial Laser Solutions, Retrieved on Sep. 20, 2023 from https://www.laserfocusworld.com/print/content/14216380, Total 8 pages.

*Primary Examiner* — Laura M Menz

(74) *Attorney, Agent, or Firm* — Sughrue Mion, PLLC

(57) ABSTRACT

A method of fabricating a semiconductor package is disclosed. The method may include providing an insulating layer, forming a seed layer to cover a top surface of the insulating layer, forming a sacrificial layer on the seed layer, forming penetration holes to penetrate the sacrificial layer and expose the seed layer, forming conductive posts in the penetration holes, removing the sacrificial layer, performing a laser irradiation process on the seed layer to form seed patterns below the conductive posts, attaching a semiconductor chip to a portion of the insulating layer which is placed between the conductive posts, and removing the insulating layer. An outer side surface of the conductive post and an outer side surface of the seed pattern may be substantially coplanar with each other, thereby forming a flat surface.

10 Claims, 25 Drawing Sheets

(56) References Cited

U.S. PATENT DOCUMENTS

| | | | | |
|---|---|---|---|---|
| 11,309,294 | B2 * | 4/2022 | Yu | H10P 72/74 |
| 11,355,378 | B2 * | 6/2022 | Hu | H10P 14/47 |
| 11,417,606 | B2 * | 8/2022 | Lin | H10P 72/74 |
| 11,527,472 | B2 | 12/2022 | Chang et al. | |
| 12,354,987 | B2 * | 7/2025 | Jin | H10W 20/42 |
| 12,568,867 | B2 * | 3/2026 | Kim | H10W 70/05 |
| 2012/0299150 | A1 * | 11/2012 | Tang | H10W 20/40<br>438/123 |
| 2013/0012014 | A1 * | 1/2013 | Lei | H10W 72/012<br>257/E21.158 |
| 2014/0054075 | A1 * | 2/2014 | Hu | H05K 3/3452<br>29/853 |
| 2014/0060902 | A1 * | 3/2014 | Hu | H05K 3/007<br>174/262 |
| 2015/0303174 | A1 * | 10/2015 | Yu | H10P 72/74<br>438/109 |
| 2017/0162536 | A1 * | 6/2017 | Arvin | H10W 20/031 |
| 2019/0238134 | A1 * | 8/2019 | Lee | H03K 19/1737 |
| 2020/0118934 | A1 * | 4/2020 | Hu | H10W 70/05 |
| 2021/0098382 | A1 * | 4/2021 | Lin | H10P 72/74 |
| 2021/0125908 | A1 * | 4/2021 | Jang | H10P 72/74 |
| 2021/0280435 | A1 * | 9/2021 | Chen | H10W 20/42 |
| 2022/0068760 | A1 * | 3/2022 | Chen | H10W 40/258 |
| 2023/0170226 | A1 * | 6/2023 | Chiang | H10W 40/22<br>257/773 |
| 2023/0317590 | A1 * | 10/2023 | Kim | H10B 80/00<br>257/773 |
| 2023/0317658 | A1 * | 10/2023 | Guevara | H10W 70/40<br>257/108 |
| 2024/0213174 | A1 * | 6/2024 | Kang | H10P 72/74 |
| 2024/0429066 | A1 * | 12/2024 | Kang | H10W 40/10 |
| 2025/0183237 | A1 * | 6/2025 | Pan | H10B 80/00 |

FOREIGN PATENT DOCUMENTS

| | | | | | |
|---|---|---|---|---|---|
| CN | 102867757 | B | * | 3/2016 | H10W 72/90 |
| CN | 111739810 | A | | 10/2020 | |
| CN | 113394165 | A | | 9/2021 | |
| CN | 114121867 | A | | 3/2022 | |
| CN | 116072664 | A | * | 5/2023 | H10W 70/611 |
| CN | 117293118 | A | * | 12/2023 | H10W 72/30 |
| CN | 121985834 | A | * | 5/2026 | |
| KR | 20250000958 | A | * | 1/2025 | H10W 40/10 |
| WO | WO-9948140 | A1 | * | 9/1999 | H10W 90/00 |
| WO | WO-2011014409 | A1 | * | 2/2011 | H10W 90/00 |

* cited by examiner

METHOD OF FABRICATING SEMICONDUCTOR PACKAGE

CROSS-REFERENCE TO RELATED APPLICATIONS

This U.S. non-provisional patent application claims priority under 35 U.S.C. § 119 to Korean Patent Application No. 10-2023-0082150, filed on Jun. 26, 2023, in the Korean Intellectual Property Office, the entire contents of which are hereby incorporated by reference.

BACKGROUND

1. Field

The disclosure relates to a semiconductor package and a method of fabricating the same, and in particular, to a semiconductor package including a redistribution substrate and a conductive post and a method of fabricating the same.

2. Description of Related Art

A semiconductor package is configured to facilitate the use of an integrated circuit chip as a component in an electronic product. In general, the semiconductor package includes a printed circuit board (PCB) and a semiconductor chip, which is mounted on the PCB and is electrically connected to the PCB using bonding wires or bumps. As the electronics industry advances, various studies are being conducted to develop a highly reliable, highly integrated, and compact semiconductor package.

In light of recent advancements in the electronics industry, the demand for high-performance, high-speed, and compact electronic components has been steadily increasing. As an integration density of a semiconductor chip increases, a size of a semiconductor chip is gradually decreasing. However, in the case where the size of the semiconductor chip is reduced, it is increasingly difficult to attach many solder balls to the semiconductor chip and to handle and test the solder balls. In addition, it is necessary to diversify a board in accordance with a size of a semiconductor chip, and this is another difficult problem. As a result, recent packaging technology is progressing in the direction of integrating a plurality of semiconductor chips within a single package. One example is a fan-out wafer-level package (FO-WLP). In the FO-WLP, mold-through vias (MTVs) are used to electrically connect redistribution patterns, which are placed on or under a semiconductor chip, and this may enable vertical stacking of boards mounted with the semiconductor chips.

SUMMARY

The disclosure provides a method of reducing a failure rate in a process of fabricating a semiconductor package and a semiconductor package fabricated thereby.

The disclosure also provides a semiconductor package, which has an improved electric connection structure and high driving stability, and a method of fabricating the same.

The disclosure also provides a semiconductor package with improved heat-dissipation characteristics and a method of fabricating the same.

According to an aspect of the disclosure, a method of fabricating a semiconductor package includes: providing an insulating layer; forming a seed layer to cover a top surface of the insulating layer; forming a sacrificial layer on the seed layer; forming penetration holes to penetrate the sacrificial layer and expose the seed layer; forming conductive posts in the penetration holes; removing the sacrificial layer; performing a laser irradiation process on the seed layer to form seed patterns below the conductive posts; attaching a semiconductor chip to a portion of the insulating layer located between the conductive posts; and removing the insulating layer, wherein an outer side surface of the conductive posts and an outer side surface of the seed patterns are substantially coplanar with each other, thereby forming a substantially flat surface.

According to an aspect of the disclosure, a method of fabricating a semiconductor package includes: providing an insulating layer; forming a seed layer to cover a top surface of the insulating layer; forming a sacrificial layer on the seed layer; forming a penetration hole to penetrate the sacrificial layer and expose the seed layer; forming a conductive post in the penetration hole; removing the sacrificial layer; irradiating a laser onto the seed layer and the conductive post to form a seed pattern below the conductive post and a heat-dissipation pattern beside the conductive post; attaching a semiconductor chip to the heat-dissipation pattern; and removing the insulating layer, wherein the conductive post is not etched by the irradiating of the laser, and the seed layer is etched by the irradiating of the laser.

According to an aspect of the disclosure, a method of fabricating a semiconductor package includes: providing an insulating layer; forming a seed layer to cover a top surface of the insulating layer; forming a sacrificial layer on the seed layer; forming a penetration hole to penetrate the sacrificial layer and expose the seed layer; forming a conductive post in the penetration hole; removing the sacrificial layer; directly irradiating a laser onto the seed layer and the conductive post to form a seed pattern below the conductive post and a heat-dissipation pattern beside the conductive post; attaching a semiconductor chip to the heat-dissipation pattern; and removing the insulating layer, wherein a width of the conductive post is equal to a width of the seed pattern.

BRIEF DESCRIPTION OF THE DRAWINGS

The above and other aspects, features, and advantages of certain embodiments of the present disclosure will be more apparent from the following description taken in conjunction with the accompanying drawings, in which.

DETAILED DESCRIPTION

The following will now describe one or more embodiments of the disclosure in conjunction with the accompanying drawings.

In this description, the phrase "a certain component is connected or coupled to a different component" may be interpreted as that "the certain component is directly connected to the different component" or "an intervening element is present between the certain component and the different component." The phrase "a certain component is in contact with a different component" may mean that "no intervening element is interposed between the certain component and the different component."

Also, when a part "includes" or "comprises" an element, unless there is a particular description contrary thereto, the part may further include other elements, not excluding the other elements.

It will be understood that, although the terms first, second, third, etc., may be used herein to describe various elements, is the disclosure should not be limited by these terms. These terms are only used to distinguish one element from another element.

As used herein, the singular forms "a," "an" and "the" are intended to include the plural forms as well, unless the context clearly indicates otherwise.

An identification code is used for the convenience of the description but is not intended to illustrate the order of each step. Each step may be implemented in an order different from the illustrated order unless the context clearly indicates otherwise.

Herein, the expression "at least one of a, b or c" indicates "only a," "only b," "only c," "both a and b," "both a and c," "both b and c," or "all of a, b, and c."

Figure 1:
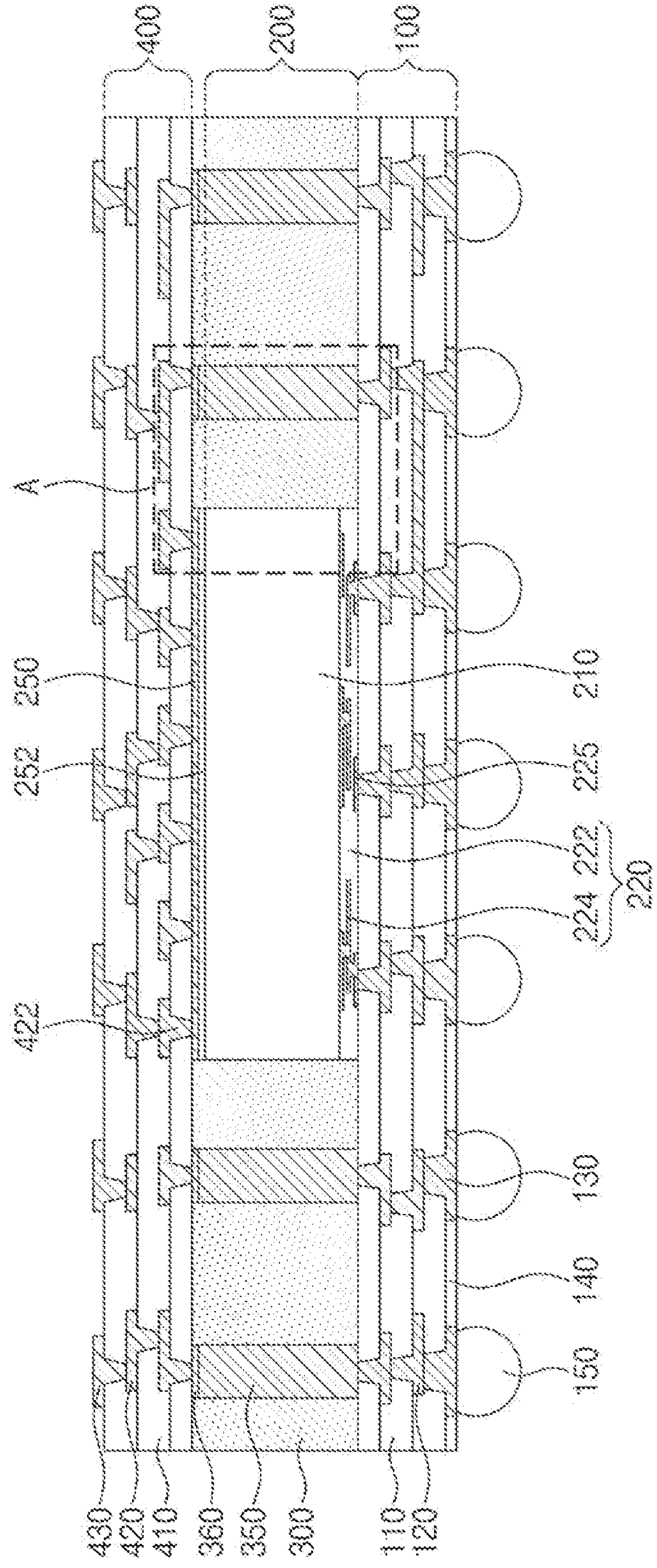
FIG. 1 is a sectional view illustrating a semiconductor package according to an embodiment of the disclosure.
Figure 2:
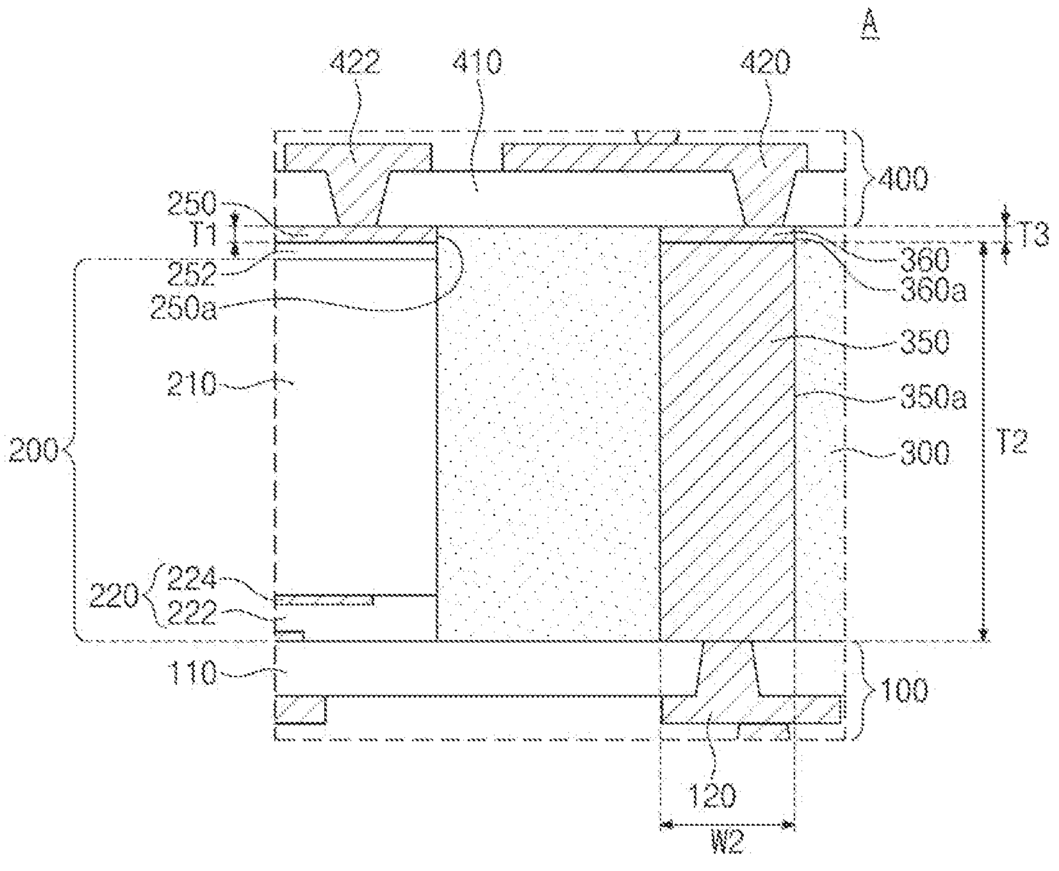
FIGS. 2 to 4 are enlarged sectional views each illustrating a portion 'A' of FIG. 1.
Figure 3:
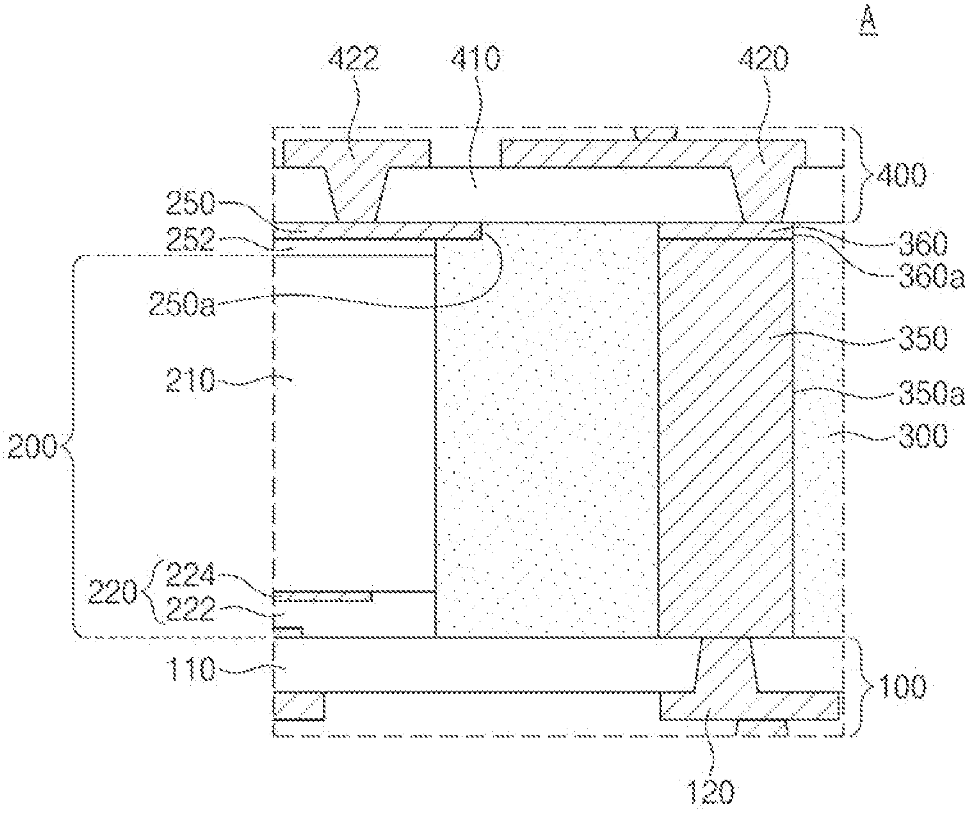
Figure 4:
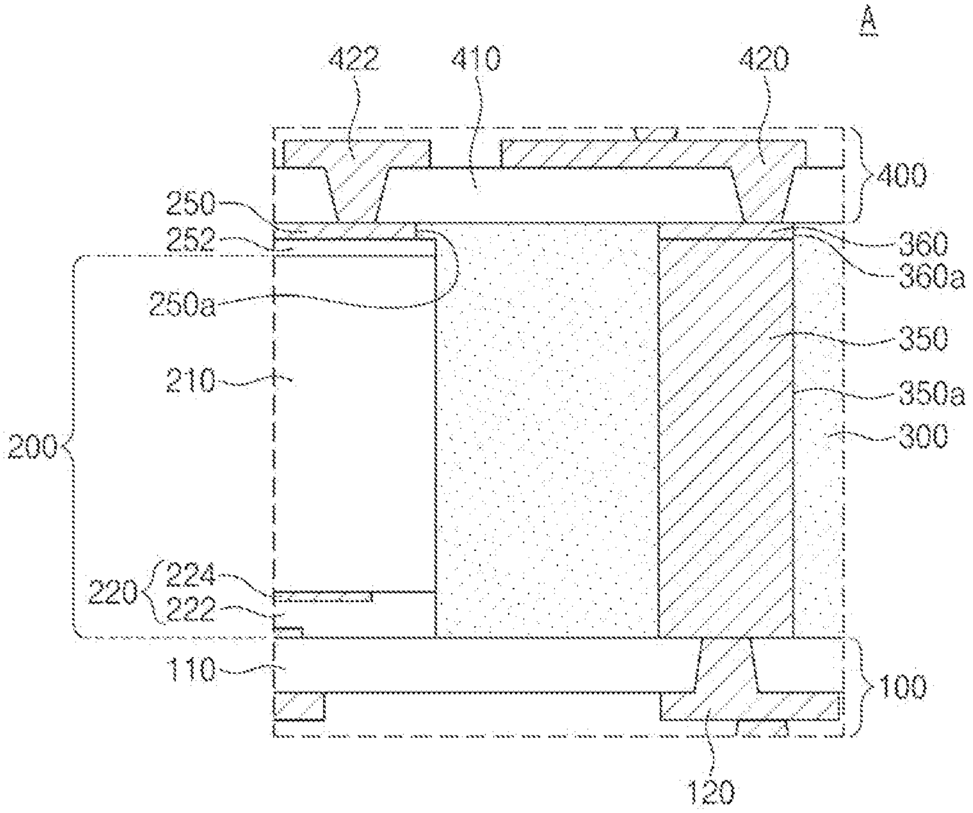

FIG. 1 is a sectional view illustrating a semiconductor package according to an embodiment of the disclosure. FIGS. 2 to 4 are enlarged sectional views each illustrating a portion "A" of FIG. 1.

Referring to FIGS. 1 and 2, a first redistribution substrate 100 may be provided. The first redistribution substrate 100 may be a substrate that is used for redistribution of an interconnection structure. For example, the first redistribution substrate 100 may include one or more first substrate interconnection layers which are stacked. Each of the first substrate interconnection layers may include a first substrate insulating pattern 110 and a first substrate interconnection pattern 120 in the first substrate insulating pattern 110. The first substrate interconnection pattern 120 of one of the first substrate interconnection layer may be electrically connected to the first substrate interconnection pattern 120 of another one of the first substrate interconnection layer adjacent thereto.

The first substrate insulating pattern 110 may be formed of or include at least one of insulating polymers or photoimageable polymers (e.g., photoimageable dielectric (PID) materials). For example, the photoimageable polymers may include at least one of photoimageable polyimide (PI), polybenzoxazole (PBO), phenol-based polymers, or benzocyclobutene-based polymers. Alternatively, the first substrate insulating pattern 110 may include an insulating material. For example, the first substrate insulating pattern 110 may be formed of or include silicon oxide (SiO), silicon nitride (SiN), silicon oxynitride (SiON), or insulating polymers.

The first substrate interconnection pattern 120 may be provided on the first substrate insulating pattern 110. The first substrate interconnection pattern 120 may be horizontally extended, on the first substrate insulating pattern 110. The first substrate interconnection pattern 120 may be provided on a bottom surface of the first substrate insulating pattern 110. The first substrate interconnection pattern 120 may include a portion that is exposed to the outside of the first substrate insulating pattern 110 near the bottom surface of the first substrate insulating pattern 110. The first substrate interconnection pattern 120 under the first substrate insulating pattern 110 may be covered with another first substrate insulating pattern 110 thereunder. A portion 130 of the first substrate interconnection pattern 120, which is provided in the lowermost one of the first substrate interconnection layers, may be coupled to an outer terminal 150, which will be described below, and will be referred to as a substrate pad 130. As described above, the first substrate interconnection pattern 120 may serve as a pad portion or a wire portion of the first substrate interconnection layer. That is, the first substrate interconnection pattern 120 may be an element for a horizontal redistribution of the first redistribution substrate 100. The first substrate interconnection pattern 120 may include a conductive material. For example, the first substrate interconnection pattern 120 may be formed of or include at least one of metallic materials (e.g., copper (Cu)).

The first substrate interconnection pattern 120 may have a damascene structure. For example, the first substrate interconnection pattern 120 may include a via portion that is protrudingly extended upward from a top surface thereof. The via portion may be configured to vertically connect the first substrate interconnection patterns 120, which are included in adjacent ones of the first substrate interconnection layers, to each other. Alternatively, the via portion may be an element, which is used to connect the first substrate interconnection pattern 120 of the uppermost one of the first substrate interconnection layers to a semiconductor chip 200 and a conductive post 350 to be described below. For example, the via portion may be extended from a top surface of the first substrate interconnection pattern 120 to penetrate the first substrate insulating pattern 110 and may be connected to a bottom surface of the first substrate interconnection pattern 120 of another first substrate interconnection layer thereon. Also, the via portion may be extended from the top surface of the first substrate interconnection pattern 120 to penetrate the uppermost one of the first substrate insulating patterns 110 and may be connected to a bottom surface of the conductive post 350 or to a first chip circuit layer 220 of the semiconductor chip 200. That is, a lower portion of the first substrate interconnection pattern 120, which is provided under the bottom surface of the first substrate insulating pattern 110, may be a head portion, which is used as a horizontal wire or a pad, and the via portion of the first substrate interconnection patterns 120 may be a tail portion. The first substrate interconnection patterns 120 may have an inverted shape of the letter "T".

A barrier layer may be interposed between the first substrate insulating pattern 110 and the first substrate interconnection patterns 120. The barrier layer may be provided to enclose the head and tail portions of the first substrate interconnection patterns 120. A thickness of a gap between the first substrate interconnection patterns 120 and the first substrate insulating pattern 110 (i.e., the barrier layer) may range from 50 Å to 1000 Å. The barrier layer may be formed of or include at least one of titanium (Ti), tantalum (Ta), titanium nitride (TiN), or tantalum nitride (TaN).

A substrate protection layer 140 may be provided. The substrate protection layer 140 may cover a bottom surface of the lowermost one of the first substrate interconnection layers. Here, the substrate protection layer 140 may enclose the substrate pads 130 on the lowermost one of the first substrate insulating patterns 110. The substrate pads 130 may be exposed to the outside of the substrate protection layer 140 near a bottom surface of the substrate protection layer 140. The substrate protection layer 140 may be formed of or include at least one of insulating polymers or photoimageable polymers (e.g., photoimageable dielectric (PID) materials). In an embodiment, the substrate protection layer 140 may not be provided.

The outer terminals 150 may be provided on the exposed bottom surfaces of the substrate pads 130. The outer terminals 150 may include solder balls or solder bumps, and the semiconductor package may be classified into a ball grid array (BGA) package, a fine ball-grid array (FBGA) package, or a land grid array (LGA) package, depending on the kind and arrangement of the outer terminals 150.

The semiconductor chip 200 may be disposed on the first redistribution substrate 100. When viewed in a plan view, the semiconductor chip 200 may be disposed on a center region of the first redistribution substrate 100. The semiconductor chip 200 may be a logic chip. Alternatively, the semiconductor chip 200 may be a memory chip, such as a DRAM, SRAM, MRAM, or FLASH memory chip. The semiconductor chip 200 may have a front surface and a rear surface. Hereinafter, in the present specification, the front surface may be a surface of a semiconductor chip, which is called an active surface, and on which integrated devices or pads are formed, and the rear surface may be another surface of the semiconductor chip that is opposite to the front surface. The semiconductor chip 200 may be disposed such that the front surface thereof faces the first redistribution substrate 100. That is, the semiconductor chip 200 may be disposed on the first redistribution substrate 100 in a face-down manner. The semiconductor chip 200 may include a chip base layer 210 and a chip circuit layer 220, which is provided on the front surface of the chip base layer 210.

The chip base layer 210 may be formed of or include silicon (Si). Integrated devices or integrated circuits may be formed in a lower portion of the chip base layer 210.

The chip circuit layer 220 may be provided on a bottom surface of the chip base layer 210. The chip circuit layer 220 may be electrically connected to the integrated device or the integrated circuit, which is formed in the chip base layer 210. For example, the chip circuit layer 220 may include a chip circuit insulating pattern 222 and a chip circuit pattern 224, which is provided in the chip circuit insulating pattern 222 and is coupled to the integrated device or the integrated circuit formed in the chip base layer 210. The chip circuit pattern 224 may include a portion 225, which is exposed to the outside of the chip circuit layer 220 near a bottom surface of the chip circuit layer 220 and is used as a chip pad of the semiconductor chip 200. A bottom surface of the semiconductor chip 200, on which the chip circuit layer 220 is provided, may be an active surface of the semiconductor chip 200.

The semiconductor chip 200 may be mounted on the first redistribution substrate 100. For example, the semiconductor chip 200 may be disposed such that the chip circuit layer 220 faces a top surface of the first redistribution substrate 100. The chip circuit layer 220 of the semiconductor chip 200 may be in contact with the top surface of the first redistribution substrate 100. At an interface between the semiconductor chip 200 and the first redistribution substrate 100, the chip pads 225 of the semiconductor chip 200 may be in contact with the first substrate interconnection patterns 120 of the first redistribution substrate 100. For example, a portion of the first substrate interconnection pattern 120 in the uppermost one of the first substrate interconnection layers of the first redistribution substrate 100 may penetrate the first substrate insulating pattern 110 and may be coupled to the chip pad 225.

In an embodiment, the semiconductor chip 200 may not be in contact with the top surface of the first redistribution substrate 100. For example, the semiconductor chip 200 may be vertically spaced apart from the top surface of the first redistribution substrate 100. In this case, the portion of the first substrate interconnection pattern 120 of the first redistribution substrate 100 may be extended toward the semiconductor chip 200 to penetrate the first substrate insulating pattern 110 and may be coupled to the chip pad 225.

A heat-dissipation pattern 250 may be provided on the semiconductor chip 200. The heat-dissipation pattern 250 may have a plate shape. A planar shape of the heat-dissipation pattern 250 may be substantially equal or similar to a planar shape of the semiconductor chip 200. For example, as shown in FIG. 2, a width of the heat-dissipation pattern 250 may be equal to a width of the semiconductor chip 200. Side surfaces 250*a* of the heat-dissipation pattern 250 may be vertically aligned to side surfaces of the semiconductor chip 200. In an embodiment, the width of the heat-dissipation pattern 250 may be larger than the width of the semiconductor chip 200, as shown in FIG. 3. The side surfaces 250*a* of the heat-dissipation pattern 250 may protrude from the side surfaces of the semiconductor chip 200 in an outward direction. In the embodiment of FIGS. 2 and 3, the heat-dissipation pattern 250 may be overlapped with the entire top surface of the semiconductor chip 200. In an embodiment, the width of the heat-dissipation pattern 250 may be smaller than the width of the semiconductor chip 200, as shown in FIG. 4. The side surfaces 250*a* of the heat-dissipation pattern 250 may be recessed from the side surfaces of the semiconductor chip 200 in an inward direction. In the embodiment of FIG. 4, the heat-dissipation pattern 250 may be overlapped with at least a portion of the top surface of the semiconductor chip 200. Hereinafter, the disclosure will be further described with reference to the embodiment of FIG. 2. The side surfaces 250*a* of the heat-dissipation pattern 250 may be substantially flat. The side surfaces 250*a* of the heat-dissipation pattern 250 may be perpendicular to the top surface of the first redistribution substrate 100. A first thickness T1 of the heat-dissipation pattern 250 may range from 1 nm to 900 nm. The heat-dissipation pattern 250 may be electrically disconnected from the semiconductor chip 200. As an example, in the semiconductor package, the heat-dissipation pattern 250 may be in an electrically-floated state. The heat-dissipation pattern 250 may be formed of or include a metallic material. For example, the metallic material may include titanium (Ti), gold (Au), or copper (Cu).

The heat-dissipation pattern 250 may be attached to the top surface of the semiconductor chip 200 using a chip adhesive layer 252. The chip adhesive layer 252 may be attached to the top surface of the semiconductor chip 200 and a bottom surface of the heat-dissipation pattern 250. The chip adhesive layer 252 may cover the entire top surface of the semiconductor chip 200. For example, side surfaces of the chip adhesive layer 252 may be vertically aligned to the side surfaces of the semiconductor chip 200 and the side surfaces 250*a* of the heat-dissipation pattern 250. However, the disclosure is not limited to this example. The chip adhesive layer 252 may include an adhesive tape. The chip adhesive layer 252 may be formed of or include a thermal interface material (TIM) (e.g., thermal grease).

A mold layer 300 may be provided on the first redistribution substrate 100. The mold layer 300 may cover the top surface of the first redistribution substrate 100. The mold layer 300 may enclose the semiconductor chip 200, when viewed in a plan view. In an embodiment, the mold layer 300 may cover the side surfaces of the semiconductor chip 200, but not the top surface of the semiconductor chip 200. In detail, a top surface of the mold layer 300 may be located at a level higher than the top surface of the semiconductor chip 200. Here, the top surface of the semiconductor chip 200 may mean a top surface of the chip base layer 210 of the semiconductor chip 200. The top surface of the semiconductor chip 200 may be closer to the first redistribution substrate 100 than the top surface of the mold layer 300. The mold layer 300 may not cover a top surface of the heat-dissipation pattern 250. In detail, the mold layer 300 may be provided to enclose the chip adhesive layer 252 and the heat-dissipation pattern 250, which are provided on the semiconductor chip 200, and the heat-dissipation pattern 250 may be exposed to the outside of the mold layer 300 near the top surface of the mold layer 300. The top surface of the mold layer 300 and the top surface of the heat-dissipation pattern 250 may be substantially coplanar with each other, thereby forming a substantially flat surface. In another embodiment, the mold layer 300 may cover the top surface of the heat-dissipation pattern 250. In other words, the semiconductor chip 200, the chip adhesive layer 252, and the heat-dissipation pattern 250 may be buried in the mold layer 300. Hereinafter, the disclosure will be further described with reference to the embodiment of FIG. 1. The mold layer 300 may be formed of or include an insulating molding material (e.g., an epoxy molding compound (EMC)).

In the case where the semiconductor chip 200 is not in contact with the first redistribution substrate 100, the mold layer 300 may be extended into a region between the semiconductor chip 200 and the first redistribution substrate 100. The mold layer 300 may fill a space between the semiconductor chip 200 and the first redistribution substrate 100. The mold layer 300 may enclose the portion of the first substrate interconnection pattern 120, which is extended from the first redistribution substrate 100 to the chip pad 225.

At least one of conductive post 350 may be provided on the first redistribution substrate 100. The conductive posts 350 may be placed next to or around the semiconductor chip 200. The conductive posts 350 may be provided to vertically penetrate the mold layer 300. The conductive post 350 may be extended toward the first redistribution substrate 100 and may be coupled to the first substrate interconnection pattern 120 of the first redistribution substrate 100. Also, the conductive post 350 may be extended toward the top surface of the mold layer 300. Top surfaces of the conductive posts 350 may be located at a level lower than the top surface of the mold layer 300. In other words, the top surfaces of the conductive posts 350 may be closer to the first redistribution substrate 100 than the top surface of the mold layer 300. A difference in level between the top surfaces of the conductive posts 350 and the top surface of the mold layer 300 may range from 1 nm to 900 nm. An outer side surface 350*a* of the conductive post 350 may be substantially flat. The outer side surface 350*a* of the conductive posts 350 may be perpendicular to the top surface of the first redistribution substrate 100. The width W of the conductive post 350 may be substantially uniform. The width W of the conductive posts 350 may range from 1 μm to 1 mm. A second thickness T2 of the conductive posts 350 may range from 1 μm to 1 mm. Here, the thickness may mean a height from the top surface of the first redistribution substrate 100 in a vertical direction. The conductive posts 350 may be provided to have an aspect ratio of 2 to 10. The conductive posts 350 may be formed of or include copper (Cu).

Seed patterns 360 may be provided on the conductive posts 350. The seed patterns 360 may be connected to the conductive posts 350, respectively. The description that follows will refer to one seed pattern 360 and one the conductive post 350, which are connected to each other. The seed pattern 360 may be in contact with a top surface of the conductive post 350. A top surface of the seed pattern 360 and the top surface of the mold layer 300 may be substantially coplanar with each other, thereby forming a substantially flat surface. In other words, the mold layer 300 may have a penetration hole, which is formed to penetrate the mold layer 300 and expose the first substrate interconnection pattern 120 of the first redistribution substrate 100, and the conductive post 350 and the seed pattern 360 may be provided to fill the penetration hole. The conductive post 350 and the seed pattern 360 may be enclosed by the mold layer 300. The seed pattern 360 may have substantially the same planar shape as the conductive post 350. For example, a width of the seed pattern 360 may be equal to the width W of the conductive post 350. The width of the seed pattern 360 may be uniform. An outer side surface 360*a* of the seed pattern 360 may be vertically aligned to the outer side surface 350*a* of the conductive post 350. The outer side surface 360*a* of the seed pattern 360 and the outer side surface 350*a* of the conductive post 350 may be substantially coplanar with each other, thereby forming a flat surface. A third thickness T3 of the seed pattern 360 may be equal to the first thickness T1 of the heat-dissipation pattern 250. The third thickness T3 of the seed pattern 360 may range from 1 nm to 900 nm. The seed pattern 360 may be formed of the same material as the heat-dissipation pattern 250. The seed pattern 360 may be formed of or include a metallic material. For example, the seed pattern 360 may be formed of or include gold (Au), copper (Cu), or titanium (Ti). The structure with one seed pattern 360 and one conductive post 350 has been described, and the remaining ones of the seed patterns 360 and the conductive posts 350 may be configured to have substantially the same features as the afore-described structure.

According to an embodiment of the disclosure, the outer side surface 360*a* of the seed pattern 360 may be substantially coplanar with the outer side surface 350*a* of the conductive post 350. In other words, the seed pattern 360 may not have any under-cut region, near the conductive post 350. Accordingly, it may be possible to prevent the conductive posts 350 from being disconnected or detached from a second redistribution substrate 400, which will be described below, or from the seed patterns 360 by the under-cut region, and thus, the semiconductor package may have improved structural stability.

Furthermore, the seed patterns 360 may have substantially the same planar shape as the conductive posts 350. That is, the seed patterns 360 may be provided to have a large area without the under-cut region, and in this case, the seed pattern 360 and the conductive post 350 may be in contact with each other with a large contact area. Thus, an electric resistance or interface resistance between the conductive post 350 and the seed pattern 360 may be lowered, and this make it possible to realize a semiconductor package with improved electric characteristics.

Referring further to FIGS. 1 and 2, the second redistribution substrate 400 may be provided on the mold layer 300 and the semiconductor chip 200. The second redistribution substrate 400 may be in direct contact with the top surface of the mold layer 300 and the top surface of the heat-dissipation pattern 250. In the case where the mold layer 300 covers the top surface of the heat-dissipation pattern 250, the second redistribution substrate 400 may be in direct contact with the top surface of the mold layer 300. The second redistribution substrate 400 may be in direct contact with top surfaces of the seed patterns 360.

The second redistribution substrate 400 may be a substrate for redistribution. For example, the second redistribution substrate 400 may include at least one of second substrate interconnection layer. Each of the second substrate interconnection layers may include a second substrate insulating pattern 410 and a second substrate interconnection pattern 420 in the second substrate insulating pattern 410. The second substrate interconnection patterns 420, which are respectively provided in adjacent ones of the second substrate interconnection layers, may be electrically connected to each other.

The second substrate insulating pattern 410 may be formed of or include at least one of insulating polymers or photoimageable polymers (e.g., photoimageable dielectric (PID) materials). For example, the photoimageable polymers may include at least one of photoimageable polyimide (PI), polybenzoxazole (PBO), phenol-based polymers, or benzocyclobutene-based polymers. Alternatively, the second substrate insulating pattern 410 may include an insulating material. For example, the second substrate insulating pattern 410 may be formed of or include silicon oxide (SiO), silicon nitride (SiN), silicon oxynitride (SiON), or insulating polymers.

The second substrate interconnection pattern 420 may be provided on the second substrate insulating pattern 410. The second substrate interconnection pattern 420 may be horizontally extended, on the second substrate insulating pattern 410. The second substrate interconnection pattern 420 may be provided on a top surface of the second substrate insulating pattern 410. The second substrate interconnection pattern 420 may include a portion that is exposed to the outside of the second substrate insulating pattern 410 near the top surface of the second substrate insulating pattern 410. The second substrate interconnection pattern 420 on the second substrate insulating pattern 410 may be covered with another second substrate insulating pattern 410 thereon. A portion of the second substrate interconnection pattern 420 in the uppermost one of the second substrate interconnection layers may be used as a substrate pad, which is coupled to an external device, another package, or another chip. As described above, the second substrate interconnection pattern 420 may be used as the pad or wire portion of the second substrate interconnection layer. In other words, the second substrate interconnection pattern 420 may be an element for a horizontal redistribution in the second redistribution substrate 400. The second substrate interconnection pattern 420 may include a conductive material. For example, the second substrate interconnection pattern 420 may be formed of or include a metallic material (e.g., copper (Cu)).

The second substrate interconnection pattern 420 may have a damascene structure. For example, the second substrate interconnection pattern 420 may include a via portion that is protrudingly extended downward from a bottom surface thereof. The via portion be configured to vertically connect the second substrate interconnection patterns 420, which are included in adjacent ones of the second substrate interconnection layers, to each other. For example, the via portion may be extended from a bottom surface of the second substrate interconnection pattern 420 to penetrate the second substrate insulating pattern 410 and may be connected to a top surface of the second substrate interconnection pattern 420 of another second substrate interconnection layer thereunder. Alternatively, the via portion may be an element, which is used to connect the second substrate interconnection pattern 420 of the lowermost one of the second substrate interconnection layers to the seed pattern 360. For example, the via portion may be extended from the top surface of the second substrate interconnection pattern 420 to penetrate the lowermost one of the second substrate insulating patterns 410 and may be connected to the top surface of the seed pattern 360. That is, an upper portion of the second substrate interconnection pattern 420, which is placed on the top surface of the second substrate insulating pattern 410, may be a head portion, which is used as a horizontal wire or pad, and the via portion of the second substrate interconnection pattern 420 may be a tail portion. The second substrate interconnection patterns 420 may have a shape of the letter 'T'.

A barrier layer may be interposed between the second substrate insulating pattern 410 and the second substrate interconnection patterns 420. The barrier layer may enclose the head and tail portions of the second substrate interconnection patterns 420. A thickness of a gap between the second substrate interconnection patterns 420 and the second substrate insulating pattern 410 (i.e., the barrier layer) may range from 50 Å to 1000 Å. The barrier layer may be formed of or include at least one of titanium (Ti), tantalum (Ta), titanium nitride (TiN), or tantalum nitride (TaN).

A portion 422 of the second substrate interconnection pattern 420 may be used to exhaust heat of the semiconductor chip 200 to the outside, and thus, it will be referred to as a heat transfer pattern 422. For example, the heat transfer pattern 422 may be a portion of the second substrate interconnection pattern 420, which is placed on the semiconductor chip 200. The heat transfer pattern 422 may penetrate the lowermost one of the second substrate insulating patterns 410 and may be connected to the top surface of the heat-dissipation pattern 250. The heat-dissipation pattern 250 may have various planar shapes. Here, the planar shape of the heat-dissipation pattern 250 may mean a shape of the via portion of the heat-dissipation pattern 250, when viewed from the top or bottom of the heat-dissipation pattern 250.

Figure 5:
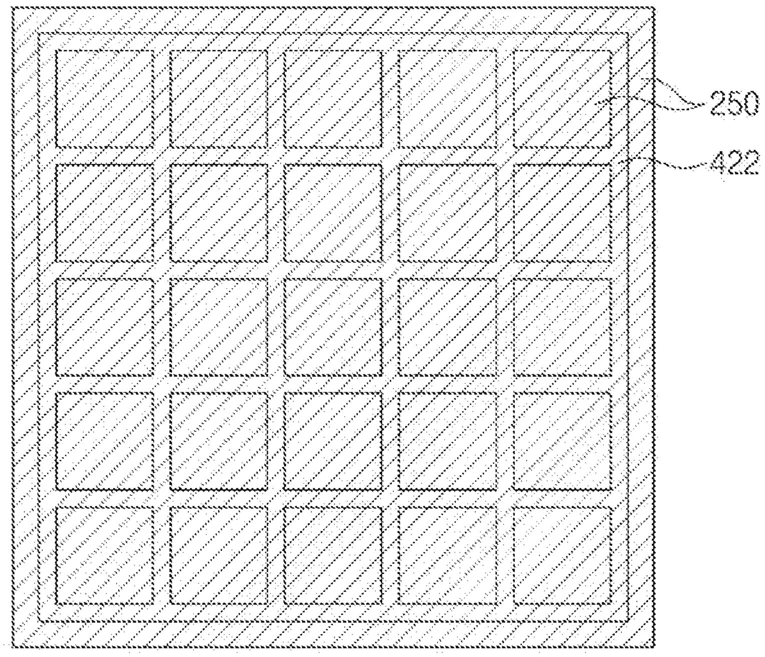
FIGS. 5 through 8 are plan views illustrating a heat-dissipation pattern and a heat-dissipation line of a semiconductor package according to an embodiment of the disclosure.

As shown in FIG. 5, the heat transfer pattern 422 may have a mesh shape, when viewed in a plan view. For example, the heat transfer pattern 422 may include first line patterns, which are placed on the top surface of the heat-dissipation pattern 250 and are extended in a first direction, and second line patterns, which are extended in a second direction. Here, the first and second directions may be defined as two different directions, which are parallel to the top surface of the heat-dissipation pattern 250 and are perpendicular to each other. The first line patterns may be spaced apart from each other in the second direction, and the second line patterns may be spaced apart from each other in the first direction. The first and second line patterns may be disposed to cross each other, thereby forming the mesh shape.

Figure 6:
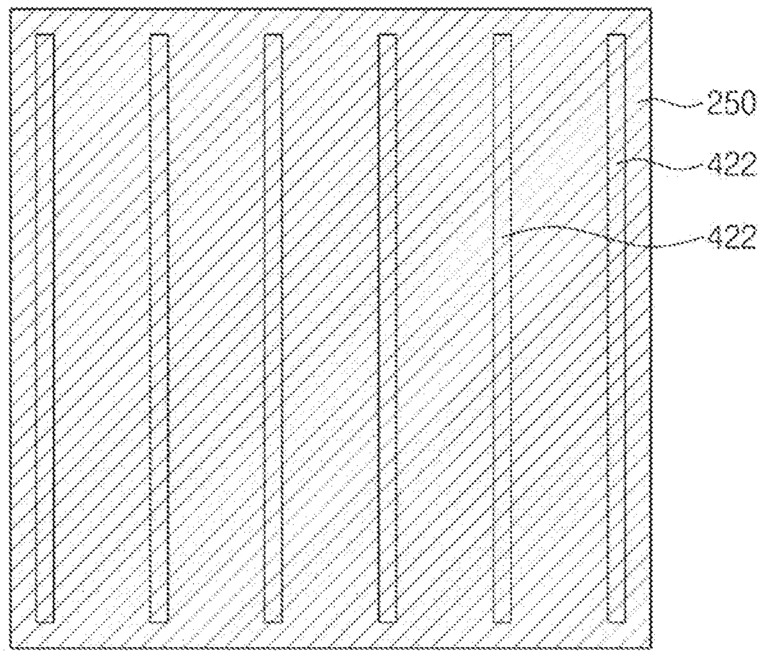

In an embodiment, as shown in FIG. 6, the heat transfer pattern 422 may include a plurality of line-shaped patterns, when viewed in a plan view. For example, the heat transfer pattern 422 may be composed of a plurality of line patterns. On the top surface of the heat-dissipation pattern 250, the line patterns may be extended in the first direction and may be spaced apart from each other in the second direction.

Figure 7:
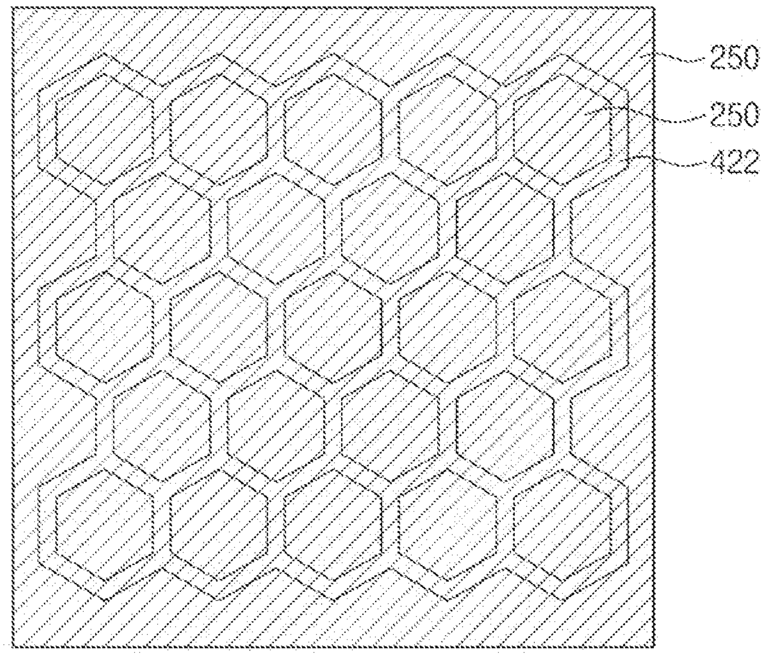

In an embodiment, as shown in FIG. 7, the heat transfer pattern 422 may have a honeycomb shape, when viewed in a plan view. For example, the heat transfer pattern 422 may include a plurality of hexagonal patterns, which penetrate the heat transfer pattern 422 vertically. Meanwhile, the heat transfer pattern 422 may include patterns of various shapes different from the shapes described above.

Figure 8:
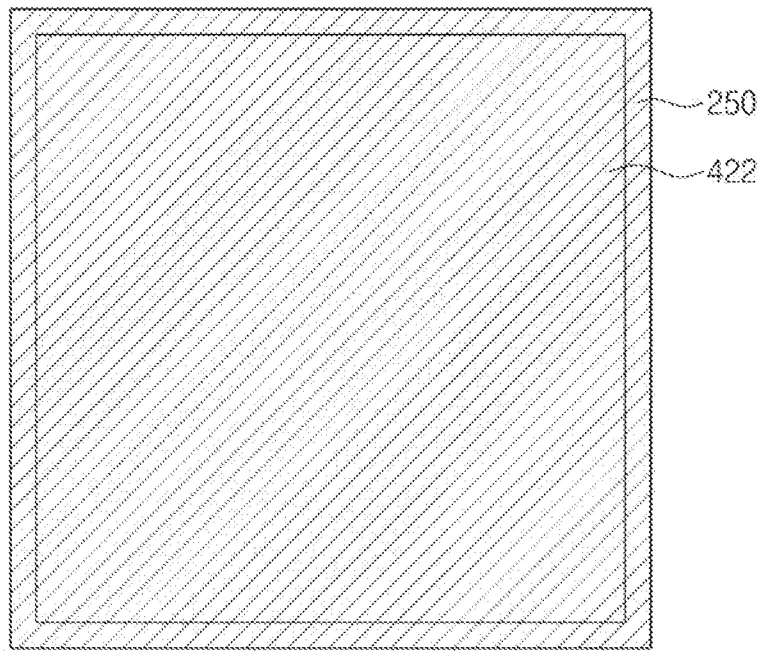

In an embodiment, as shown in FIG. 8, the heat transfer pattern 422 may have a plate shape. For example, the heat transfer pattern 422 may be a rectangular, tetragonal, circular, elliptical, or polygonal shape, when viewed in a plan view. The planar shape of the heat transfer pattern 422 may correspond to the planar shape of the heat-dissipation pattern 250. A width of the heat transfer pattern 422 may be substantially equal to or smaller than a width of the heat-dissipation pattern 250.

So far, some examples of the planar shape of the heat transfer pattern 422 have been described with reference to FIGS. 5 to 8, but the disclosure is not limited to these examples. The planar shape of the heat transfer pattern 422 may be changed in various ways, if necessary.

The head portion of the heat-dissipation pattern 250 may have the same or similar shape as the via portion of the heat-dissipation pattern 250 or have a plate shape, when viewed in a plan view.

The heat transfer pattern 422 may be electrically disconnected from the semiconductor chip 200. For example, the second substrate interconnection pattern 420 of the second redistribution substrate 400 may include a first portion that is connected to the semiconductor chip 200 through the conductive posts 350 and the first redistribution substrate 100. Also, the second substrate interconnection pattern 420 of the second redistribution substrate 400 may include a second portion that is not electrically connected to the first portion of the second substrate interconnection pattern 420. The second portion of the second substrate interconnection pattern 420 may be coupled to the heat transfer pattern 422. However, the disclosure is not limited to this example. In an embodiment, the heat transfer pattern 422 may be a portion of the second substrate interconnection pattern 420 electrically connected to the semiconductor chip 200. Heat, which is generated in the semiconductor chip 200, may be transferred to the heat transfer pattern 422 through the heat-dissipation pattern 250. In this case, the heat in the heat transfer pattern 422 may be exhausted to a region on the second redistribution substrate 400 through the second substrate interconnection pattern 420.

According to an embodiment of the disclosure, the heat-dissipation pattern 250 may be provided on a rear surface of the semiconductor chip 200, and the second substrate interconnection pattern 420 of the second redistribution substrate 400, which is placed on the rear surface of the semiconductor chip 200, may be used as the heat transfer pattern 422 for heat dissipation. Accordingly, the heat-dissipation efficiency of the semiconductor package may be improved.

FIG. 1 illustrates an example in which the second substrate interconnection patterns 420 of the second redistribution substrate 400 have a shape of the letter ‘T’, but the disclosure is not limited to this example. In an embodiment, the second substrate interconnection patterns 420 may have an inverted shape of the letter ‘T’. In detail, the second substrate interconnection pattern 420 in each of second substrate interconnection layer may be horizontally extended, below the second substrate insulating pattern 410. The second substrate interconnection pattern 420 may be provided on a bottom surface of the second substrate insulating pattern 410. The second substrate interconnection pattern 420 may include a portion that is exposed to the outside of the second substrate insulating pattern 410 near the bottom surface of the second substrate insulating pattern 410. The second substrate interconnection pattern 420 on the second substrate insulating pattern 410 may be covered with another second substrate insulating pattern 410 thereunder.

The second substrate interconnection pattern 420 may have a damascene structure. For example, the second substrate interconnection pattern 420 may include a via portion that is protrudingly extended upward from a top surface thereof. The via portion may be extended from the top surface of the second substrate interconnection pattern 420 to penetrate the second substrate insulating pattern 410 and may be connected to a bottom surface of the second substrate interconnection pattern 420 of another second substrate interconnection layer thereon. A lower portion of the second substrate interconnection pattern 420, which is placed on the bottom surface of the second substrate insulating pattern 410, may be a head portion, which is used as a horizontal wire or pad, and the via portion of the second substrate interconnection pattern 420 may be a tail portion. The second substrate interconnection patterns 420 may have an inverted shape of the letter ‘T’.

The heat transfer pattern 422 may be a portion of the second substrate interconnection pattern 420, which is placed on the semiconductor chip 200. Here, the planar shape of the heat-dissipation pattern 250 may mean a shape of the head portion of the heat-dissipation pattern 250, when viewed from the top or bottom of the heat-dissipation pattern 250.

Figure 9:
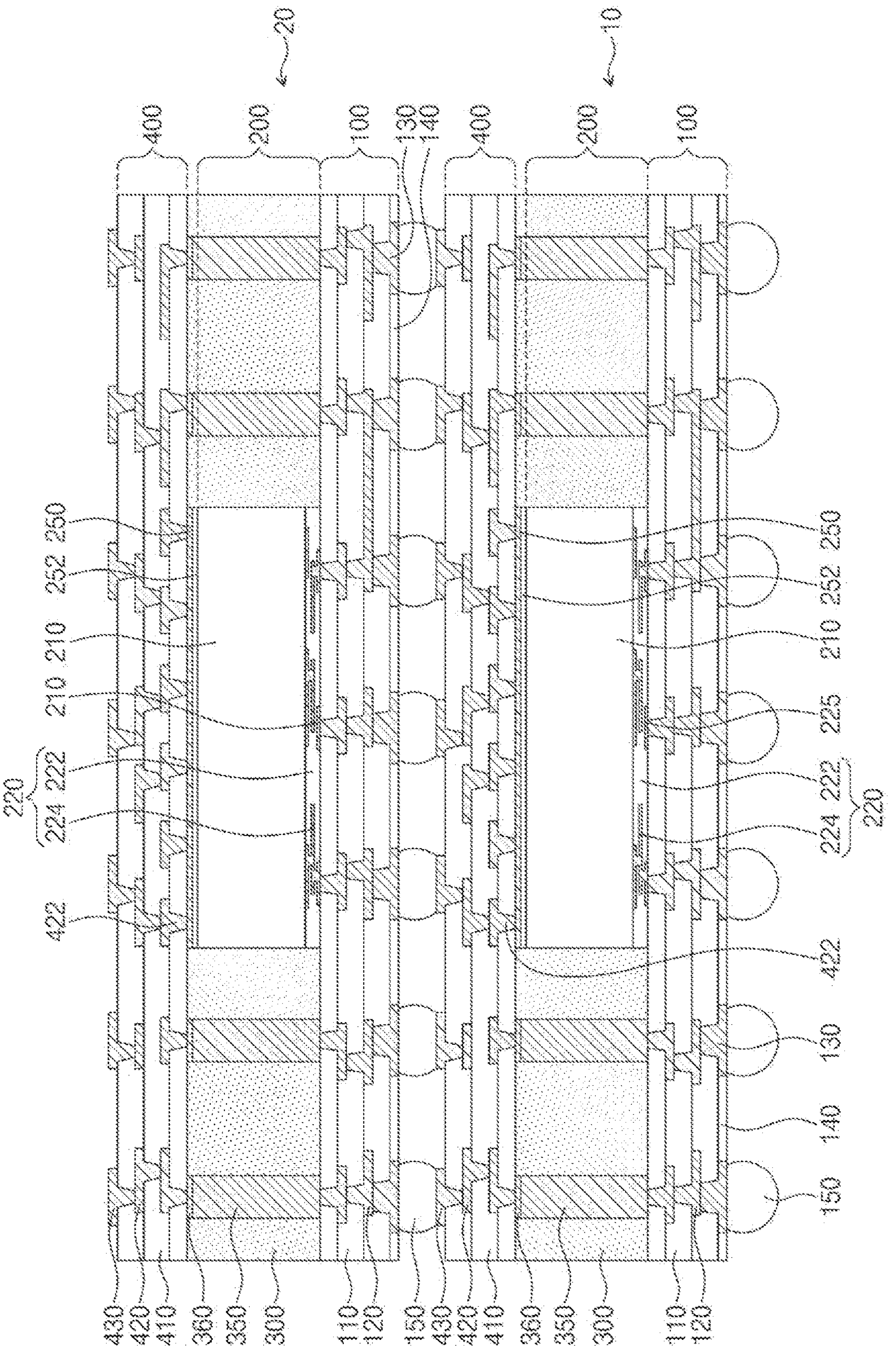
FIG. 9 is a sectional view illustrating a semiconductor package according to an embodiment of the disclosure.

FIG. 9 is a sectional view illustrating a semiconductor package according to an embodiment of the disclosure.

Referring to FIG. 9, a semiconductor package may include a lower package 10 and an upper package 20. That is, the semiconductor package may be a package-on-package (POP) structure, in which the upper package 20 is mounted on the lower package 10.

The lower package 10 may have the same or similar structure as that of FIGS. 1 to 8. For example, the lower package 10 may include the first redistribution substrate 100, the semiconductor chip 200 mounted on the first redistribution substrate 100, the second redistribution substrate 400 provided on the semiconductor chip 200, the mold layer 300 provided between the first and second redistribution substrates 100 and 400 to enclose the semiconductor chip 200, the conductive posts 350 provided at a side of the semiconductor chip 200 to penetrate the mold layer 300 and connect the first and second redistribution substrates 100 and 400 to each other, the heat-dissipation pattern 250 interposed between the semiconductor chip 200 and the second redistribution substrate 400, and the seed patterns 360 interposed between the conductive posts 350 and the second redistribution substrate 400. The second substrate interconnection pattern 420, which is provided in the uppermost second substrate interconnection layer of the second redistribution substrate 400, may include an upper substrate pad 430, on which the upper package 20 is mounted. The upper substrate pads 430 may be exposed to the outside of the second substrate insulating pattern 410 near the top surface of the second substrate Insulating pattern 410. The heat-dissipation pattern 250 and the seed patterns 360 may be formed of or include the same material and may have the same thickness. The side surface of the heat-dissipation pattern 250 and the outer side surface of the seed pattern 360 may be substantially flat and may be perpendicular to the top surface of the first redistribution substrate 100.

The upper package 20 may have the same or similar structure as that of FIGS. 1 to 8. For example, the upper package 20 may include the first redistribution substrate 100, the semiconductor chip 200 mounted on the first redistribution substrate 100, the second redistribution substrate 400 provided on the semiconductor chip 200, the mold layer 300 provided between the first and second redistribution substrates 100 and 400 to enclose the semiconductor chip 200, the conductive posts 350 provided at a side of the semiconductor chip 200 to penetrate the mold layer 300 and connect the first and second redistribution substrates 100 and 400 to each other, the heat-dissipation pattern 250 interposed between the semiconductor chip 200 and the second redistribution substrate 400, and the seed patterns 360 interposed between the conductive posts 350 and the second redistribution substrate 400. The heat-dissipation pattern 250 and the seed patterns 360 may be formed of or include the same material and may have the same thickness. The side surface of the heat-dissipation pattern 250 and the outer side surface of the seed pattern 360 may be substantially flat and may be perpendicular to the top surface of the first redistribution substrate 100. In an embodiment, various other packages, devices, or elements may be provided as the upper package 20. For example, the upper package 20 may be a single-chip package, which includes a package substrate, a semiconductor chip mounted on the package substrate, and a mold layer provided on the package substrate to encapsulate the semiconductor chip, or a multi-chip package including a plurality of semiconductor chips.

The upper package 20 may be mounted on the lower package 10. For example, the outer terminals 150 may be provided on the substrate pads 130 of the upper package 20. The outer terminals 150 of the upper package 20 may be coupled to the upper substrate pads 430 of the lower package 10.

FIGS. 10A to 18A are sectional views illustrating a method of fabricating a semiconductor package, according to an embodiment of the disclosure. FIGS. 10B to 18B are enlarged sectional views each illustrating portions B of FIGS. 10A to 18A, respectively.

Figure 10A:
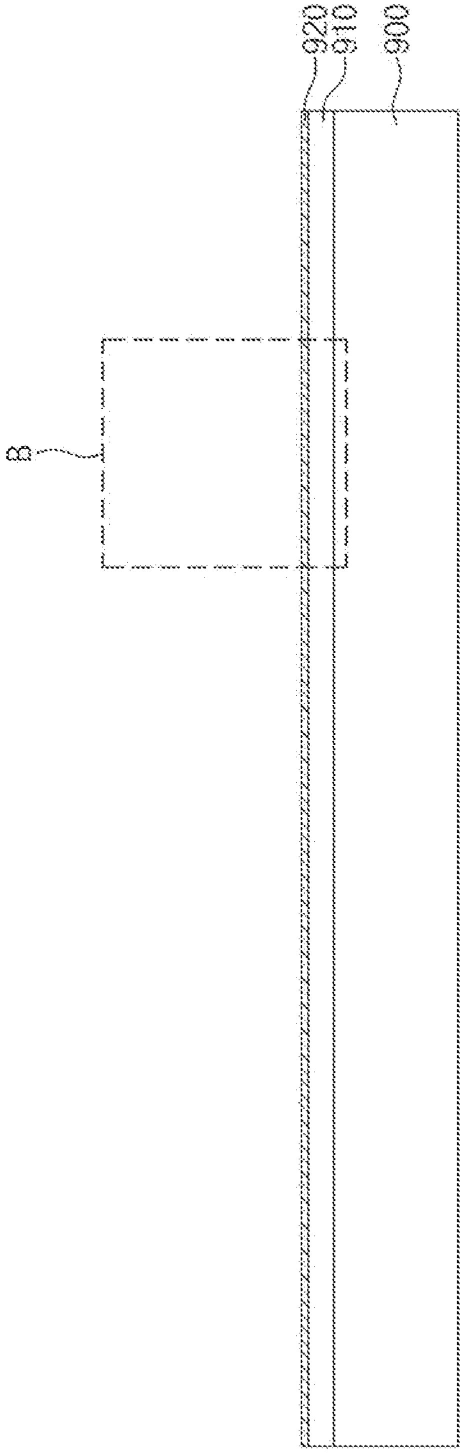
FIGS. 10A, 11A, 12A, 13A, 14A, 15A, 16A, 17A and 18A are sectional views illustrating a method of fabricating a semiconductor package according to an embodiment of the disclosure.
Figure 10B:
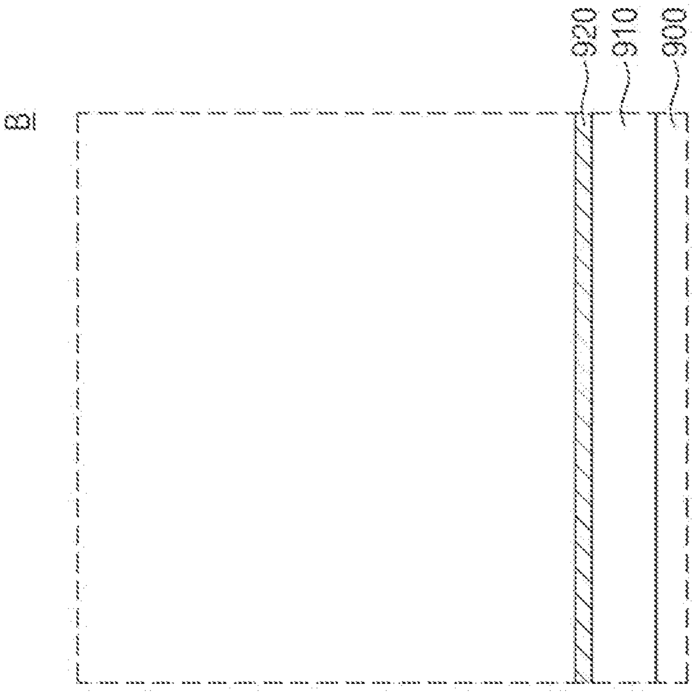
FIGS. 10B, 11B, 12B, 13B, 14B, 15B, 16B, 17B and 18B are enlarged sectional views each illustrating portions B of FIGS. 10A, 11A, 12A, 13A, 14A, 15A, 16A, 17A and 18A, respectively.

Referring to FIGS. 10A and 10B, a carrier substrate 900 may be provided. The carrier substrate 900 may be an insulating substrate, which is formed of or includes glass or polymer, or a conductive substrate, which is formed of or includes a metallic material. An adhesive member may be provided on a top surface of the carrier substrate 900. As an example, the adhesive member may include an adhesive tape.

An insulating layer 910 may be formed on the carrier substrate 900. For example, the insulating layer 910 may be formed by depositing or coating an insulating material on the top surface of the carrier substrate 900. The insulating layer 910 may cover the entire top surface of the carrier substrate 900. The insulating layer 910 may include a photoresist material. The insulating layer 910 may be formed of or include at least one of polyimide (PI) or PI-based polymers.

A seed layer 920 may be formed on the insulating layer 910. For example, the seed layer 920 may be formed by attaching a metal foil of a metallic material to the insulating layer 910 or by depositing or plating the metallic material on the insulating layer 910. The seed layer 920 may cover the entire top surface of the insulating layer 910. A thickness of the seed layer 920 may range from 1 nm to 1 μm. In particular, the thickness of the seed layer 920 may range from 1 nm to 900 nm. In the case where the thickness of the seed layer 920 is larger than 1 μm, there may be a difficulty in a process of patterning the seed layer 920 to be described below. In the case where the thickness of the seed layer 920 is smaller than 1 nm, there may be difficulty in achieving a high uniformity in the thickness of the seed layer 920. As an example, there may be a technical issue, such as non-deposition, non-plating, or loss of the seed layer 920, in some regions. The metallic material may contain a metal element (e.g., copper (Cu)).

Figure 11A:
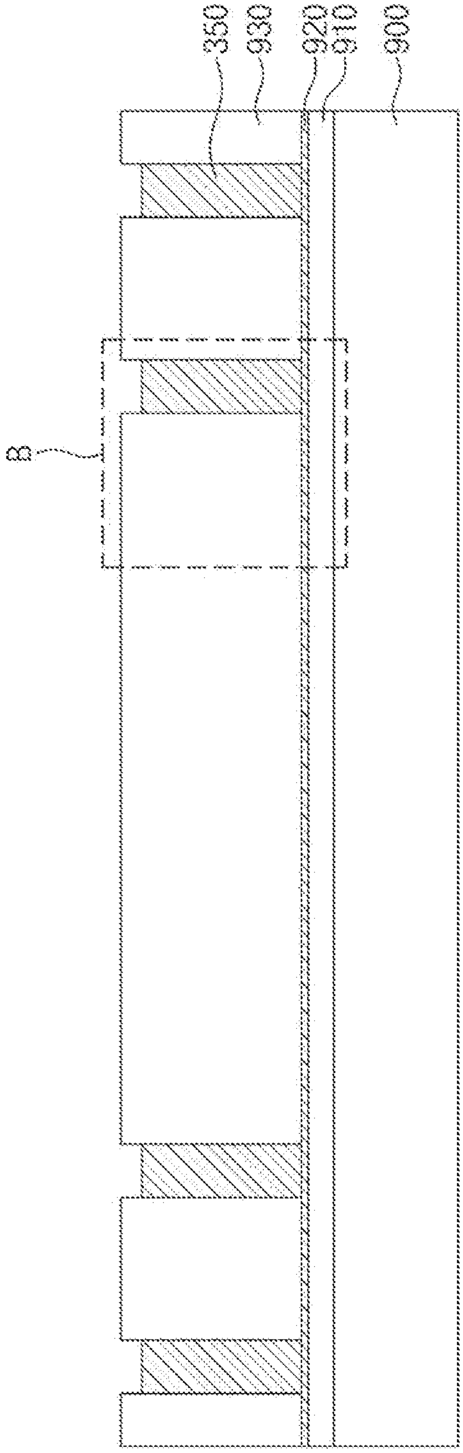
Figure 11B:
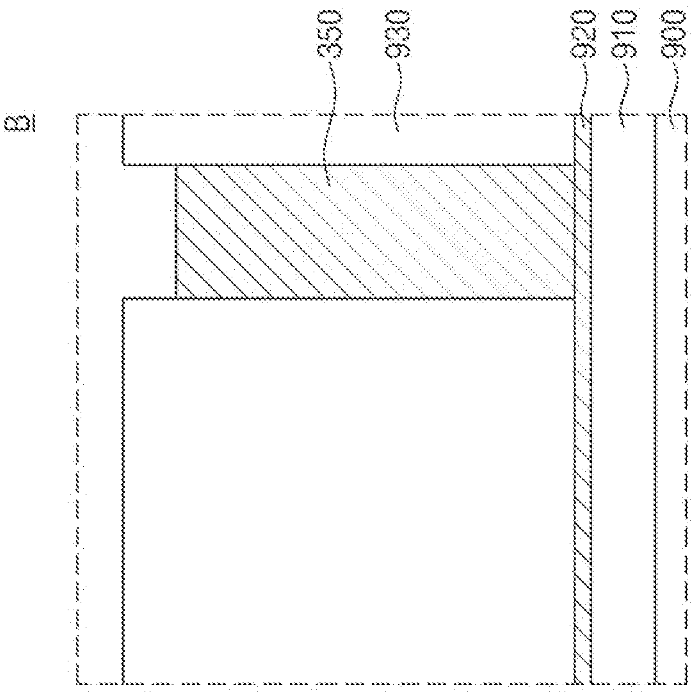

Referring to FIGS. 11A and 11B, a sacrificial layer 930 may be formed on the seed layer 920. A thickness of the sacrificial layer 930 may range from 1 μm to 1 mm. The sacrificial layer 930 may be formed of or include a photo-imageable material. As an example, the sacrificial layer 930 may include at least one of acrylate-based polymers.

Penetration holes may be formed in the sacrificial layer 930. For example, the penetration holes may be formed by performing an exposure and developing process on the sacrificial layer 930. The penetration holes may vertically penetrate the sacrificial layer 930 and expose a top surface of the seed layer 920.

FIGS. 11A and 11B illustrates an example, in which the penetration hole is formed to have a flat side surface that is perpendicular to the top surface of the seed layer 920, but the disclosure is not limited to this example. In an embodiment, the side surface of the penetration hole may be inclined at an angle to the top surface of the seed layer 920. In other words, a width of the penetration hole may decrease as a distance from the top surface of the seed layer 920 increases. Alternatively, the width of the penetration hole may decrease as a distance to a center of the penetration hole decreases. That is, when viewed in a sectional view, the side surface of the penetration hole may have a concave shape.

The conductive posts 350 may be formed in the penetration holes. For example, the penetration hole may be filled with a metallic material by a plating process using the seed layer 920, which is exposed through the penetration hole, as a seed layer. The metallic material may be formed to fill the penetration hole and cover a top surface of the sacrificial layer 930. Thereafter, an etch-back process may be performed on the metallic material to form the conductive post 350 in the penetration hole. In an embodiment, the etch-back process may be performed to remove a portion of the metallic material, which is placed on the top surface of the sacrificial layer 930 and in upper regions of the penetration holes. In an embodiment, the plating process may be performed such that a top surface of the metallic material is located within the penetration holes. The metallic material in the penetration holes may constitute the conductive posts 350.

In another embodiment, a seed/barrier layer may be formed in the penetration holes before the formation of the conductive posts 350. For example, the seed/barrier layer may be formed by depositing or coating a metal layer to conformally cover the side and bottom surfaces of the penetration holes and the top surface of the sacrificial layer 930. The seed/barrier layer may be formed of or include at least one of metallic materials (e.g., gold (Au), titanium (Ti), and tantalum (Ta)) or metal nitride materials (e.g., titanium nitride (TiN) and tantalum nitride (TaN)). In an embodiment, the seed/barrier layer may not be formed.

In the case where the seed/barrier layer is formed in the penetration hole, a plating process may be performed using the seed/barrier layer as a seed layer. A metallic material, which fills the penetration holes and covers the top surface of the sacrificial layer 930, may be formed through the plating process, and then, the conductive posts 350 may be formed by removing the metallic material and the seed/barrier layer from the top surface of the sacrificial layer 930. Hereinafter, the disclosure will be described with reference to the embodiment of FIGS. 11A and 11B.

Figure 12A:
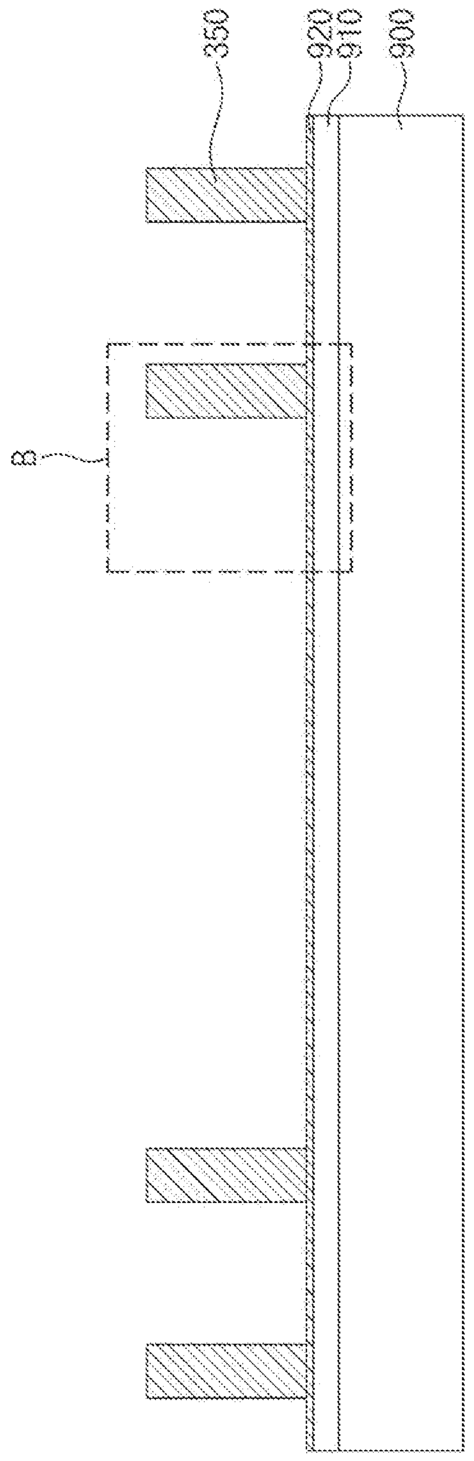
Figure 12B:
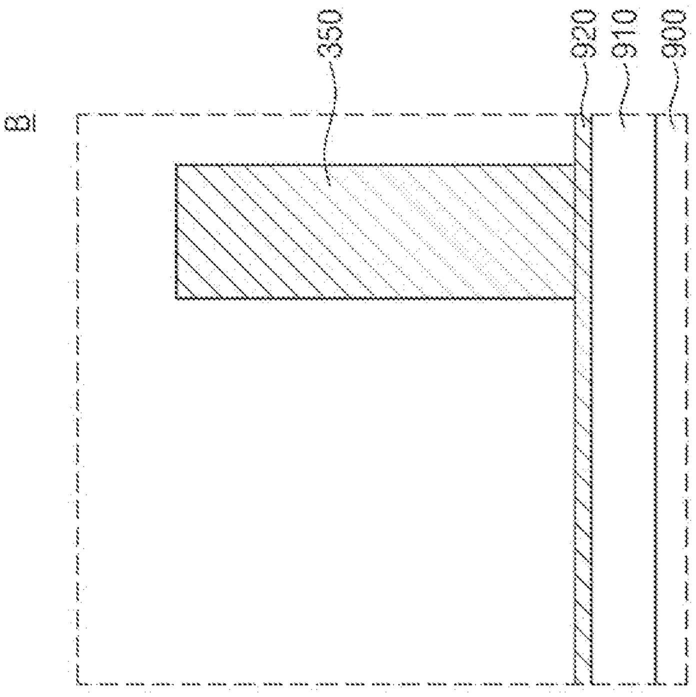

Referring to FIGS. 12A and 12B, a process of removing the sacrificial layer 930 may be performed on the structure of FIGS. 11A and 11B. For example, the process may include a strip process. The strip process may be a wet etching process. In detail, dissolving solution may be used to dissolve the sacrificial layer 930. In an embodiment, the dissolving solution may include tetramethylammonium hydroxide (TMAH).

As a result of the removal of the sacrificial layer 930, the top surface of the seed layer 920 and the outer side surfaces of the conductive posts 350 may be exposed to the outside.

Figure 13A:
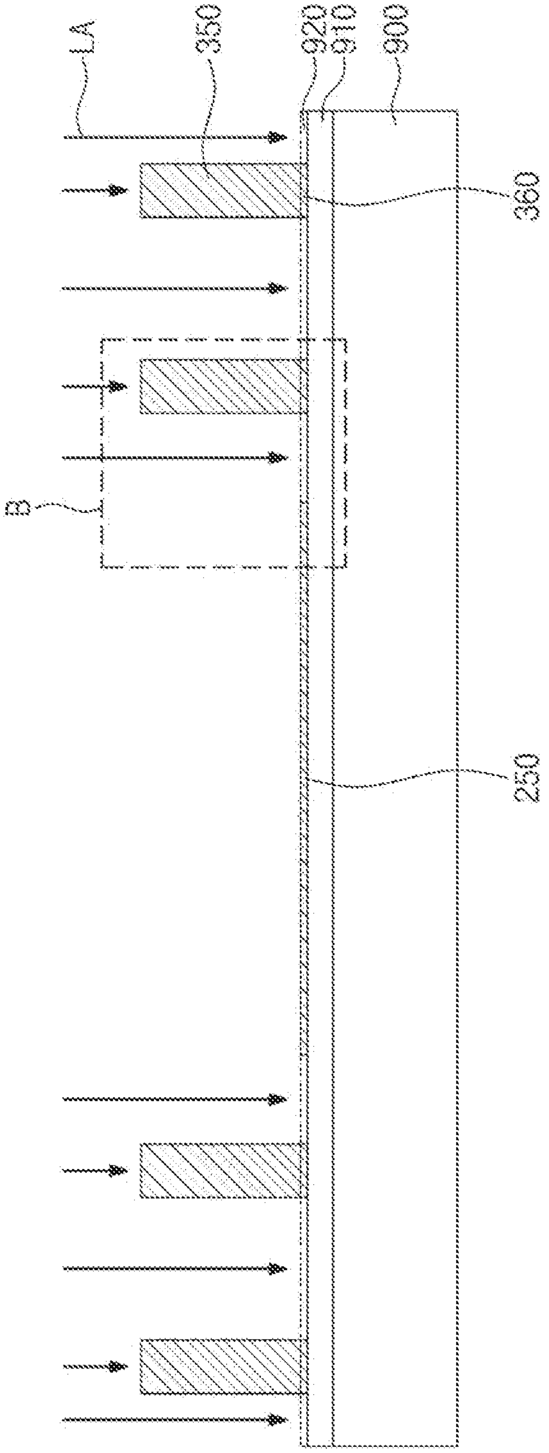
Figure 13B:
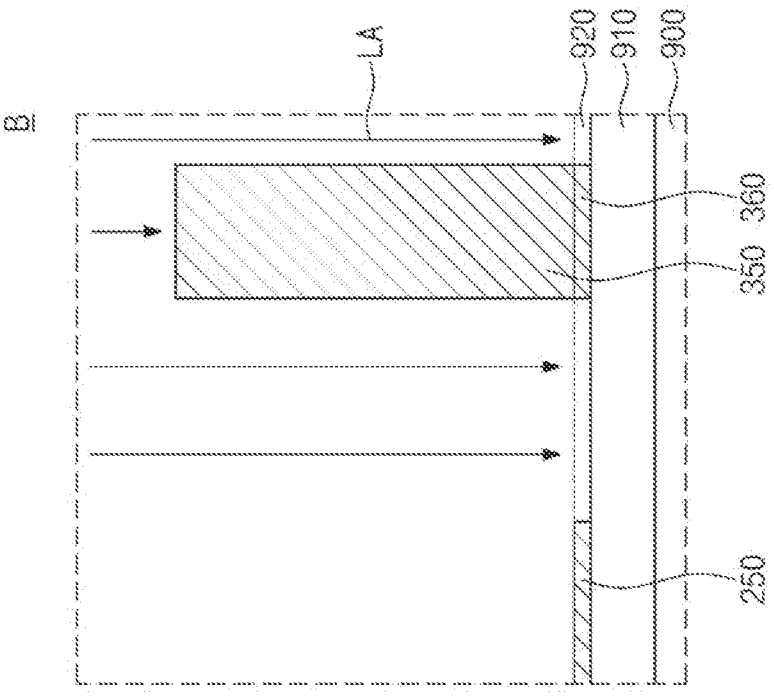

Referring to FIGS. 13A and 13B, the seed layer 920 may be patterned. The patterning process may include a laser irradiation process. In detail, a laser LA may be irradiated onto the seed layer 920 and the conductive posts 350. The laser LA may be irradiated onto at least a portion of the seed layer 920 and the conductive posts 350. Here, the at least portion of the seed layer 920 irradiated with the laser LA may be removed, and the conductive posts 350 irradiated with the laser LA may not be removed. In detail, the laser LA, which is used in the laser irradiation process, may include an excimer laser. Since the excimer laser has a short emission wavelength and a high output power, the excimer laser may be used to etch a metal film. For example, in the case where the metal film has a thickness of 1 μm or less, the metal film may be etched by the excimer laser. By contrast, in the case where a metal layer has a thickness of 1 μm or larger, the excimer laser may be absorbed by the metal layer. Thus, the seed layer 920 may be etched by the laser LA and the conductive posts 350 may not be etched by the laser LA, because the seed layer 920 has a thickness ranging from 1 nm to 900 nm and the conductive posts 350 has a thickness and a width ranging from 1 μm to 1 mm. Due to the straightly propagating property of the laser LA, the layer (i.e., the seed patterns 360), which is placed below the conductive posts 350 after the patterning process, may be formed to have a planar shape corresponding to the conductive posts 350. In detail, an outer side surface of the seed pattern 360 may be coplanar with an outer side surface of the conductive post 350. Furthermore, the outer side surface of the seed patterns 360 and the outer side surface of the conductive posts 350 may be perpendicular to the top surface of the insulating layer 910 and may be substantially flat. The seed pattern 360 may have substantially the same width as the conductive post 350. Since the insulating layer 910 below the seed layer 920 is formed of a photoresist material, the laser LA may not etch or pass through the insulating layer 910 during the process of etching the seed layer 920. As a result of the patterning of the seed layer 920, at least a portion of the top surface of the insulating layer 910 may be exposed to the outside.

According to an embodiment of the disclosure, the seed layer 920, but not the conductive posts 350, may be patterned by the laser irradiation process, even without using an additional mask pattern. In addition, the outer side surface of the seed patterns 360 and the outer side surface of the conductive posts 350 may be coplanar with each other, thereby forming a flat surface. In the case where a patterning process using etching solution is used, the seed patterns 360 under the conductive posts 350 may be over-etched to form an under-cut region, but according to an embodiment of the disclosure, the under-cut region may not be formed in the seed patterns 360. Thus, it may be possible to prevent an adhesive strength between the seed patterns 360 and the conductive posts 350 or between the seed patterns 360 and the insulating layer 910 from being deteriorated by the under-cut region and thereby prevent the conductive posts 350 from being detached from the insulating layer 910. In addition, since the conductive posts 350 is thick enough to be hardly etched by the laser LA, the conductive posts 350 may not be deformed during the process of patterning the seed layer 920. That is, it may be possible to reduce a failure rate in a process of fabricating a semiconductor package.

Moreover, the seed patterns 360 and the heat-dissipation pattern 250 may be formed simultaneously using just one seed layer (i.e., 920), and thus, the fabrication process of the semiconductor package may be simplified.

Referring to FIGS. 13A and 13B, a portion 250 of the seed layer 920, which is placed between the conductive posts 350, may not be removed. For example, the laser LA may not be irradiated onto the portion 250 of the seed layer 920. Since the laser LA has excellent directionality, the patterning process may be performed on a desired region in a relatively precise manner, even without an additional mask pattern. Accordingly, it may be easy to determine the region where the laser LA will be irradiated. For example, the laser LA may be controlled to avoid irradiating a region where the semiconductor chip 200 will be attached in a subsequent operation. A portion of the seed layer 920, which is not exposed to the laser LA, may be left unetched to form the heat-dissipation pattern 250. Due to the straightly propagating property of the laser LA, a side surface of the heat-dissipation pattern 250 may be perpendicular to the top surface of the insulating layer 910 and may have a substantially flat shape, after the patterning process.

Since the seed layer 920 is commonly used to form the heat-dissipation pattern 250 and the seed patterns 360, the heat-dissipation pattern 250 and the seed patterns 360 may be formed to have substantially the same thickness. For example, the thickness of the heat-dissipation pattern 250 and the thickness of the seed patterns 360 may range from 1 nm to 900 nm.

Figure 14A:
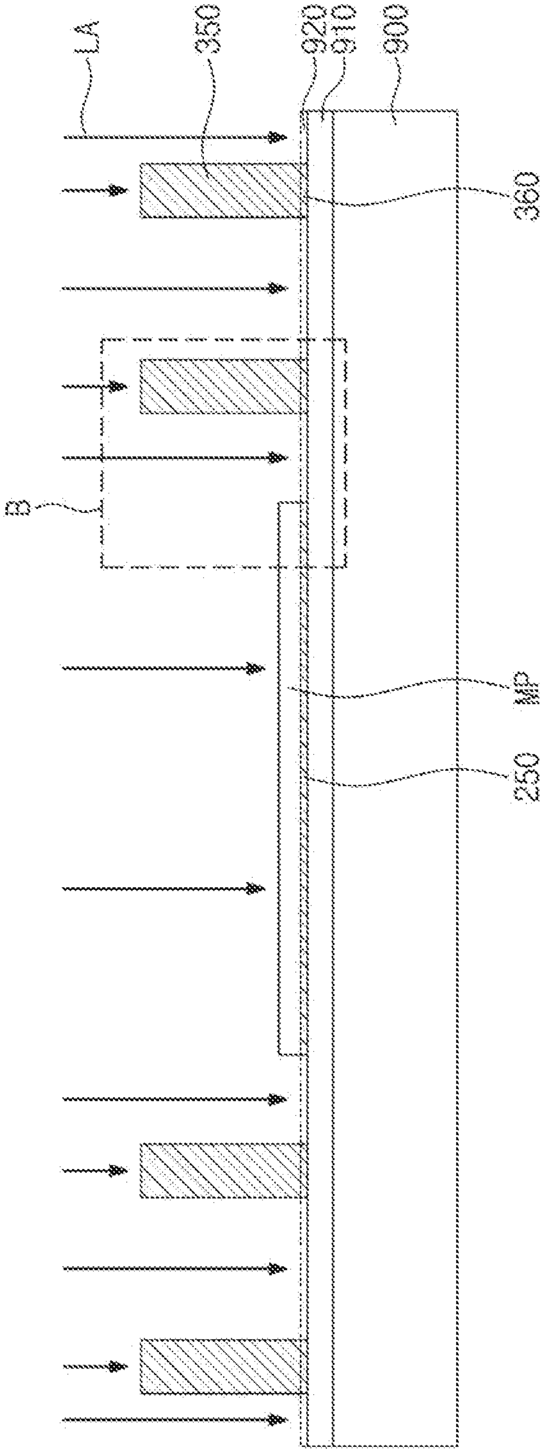
Figure 14B:
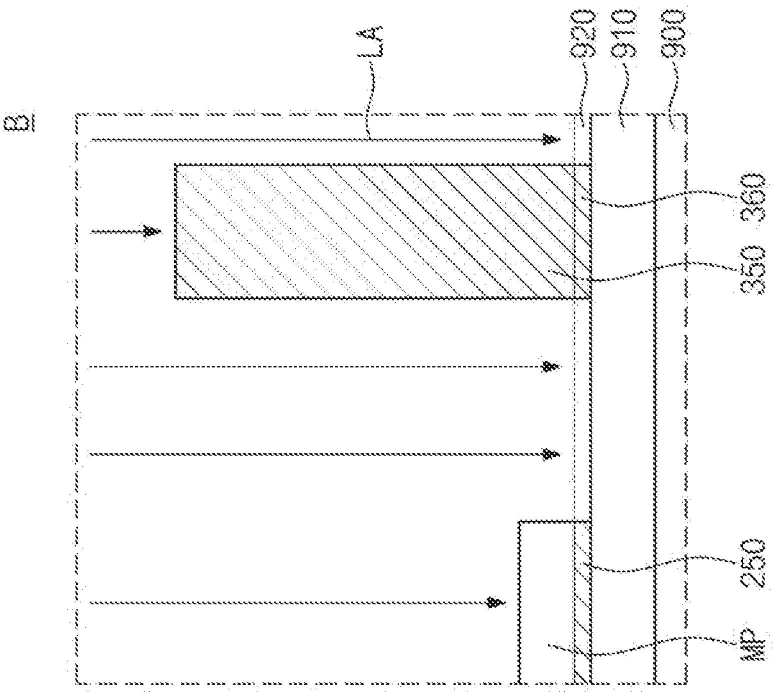

In another embodiment, before the laser irradiation process, a mask pattern MP may be formed on the portion 250 of the seed layer 920, as shown in FIGS. 14A and 14B. A region with the mask pattern MP may correspond to a region where the semiconductor chip 200 is attached in a subsequent operation. Thereafter, the laser LA may be irradiated onto the mask pattern MP, the seed layer 920, and the conductive posts 350. Due to the presence of the mask pattern MP, it may be possible to pattern the seed layer 920 more accurately, and furthermore, it may be possible to perform the laser irradiation process by exposing the entire top surface of the carrier substrate 900 to the laser LA. The portion 250 of the seed layer 920, which is left under the mask pattern MP after the laser irradiation process, may form the heat-dissipation pattern 250. Next, the mask pattern MP may be removed. Hereinafter, the disclosure will be further described with reference to the embodiment of FIGS. 13A and 13B.

Figure 15A:
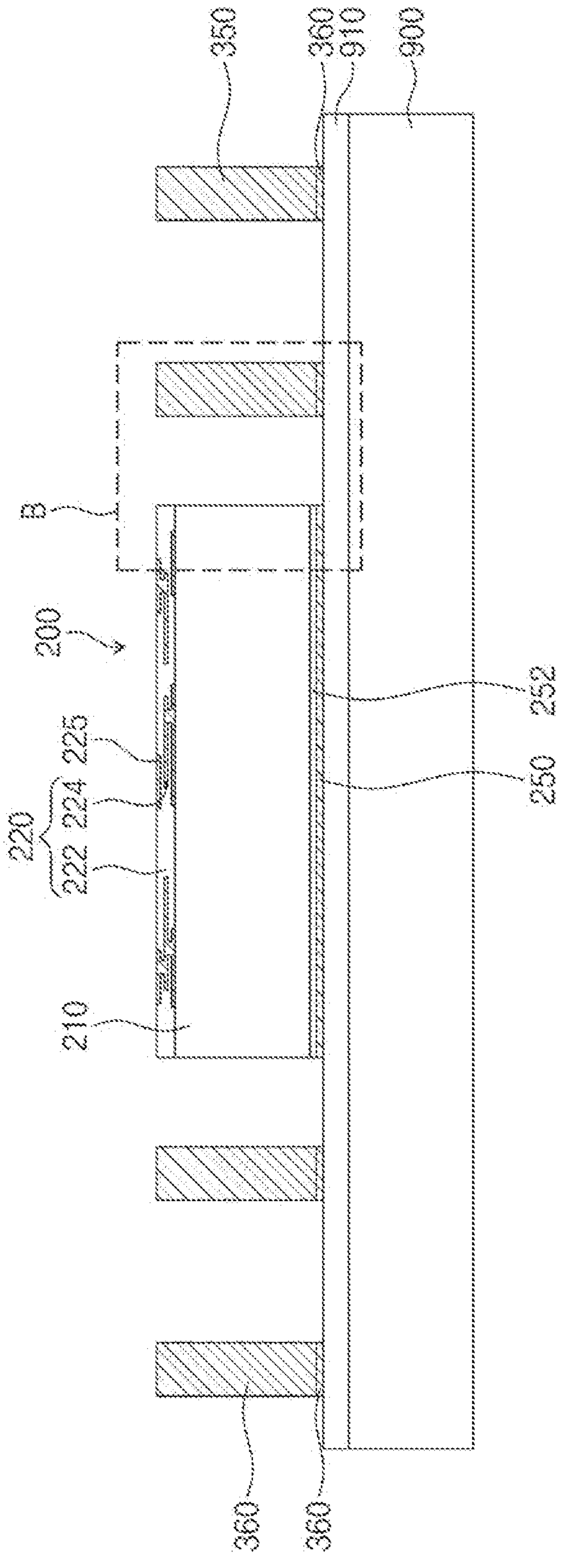
Figure 15B:
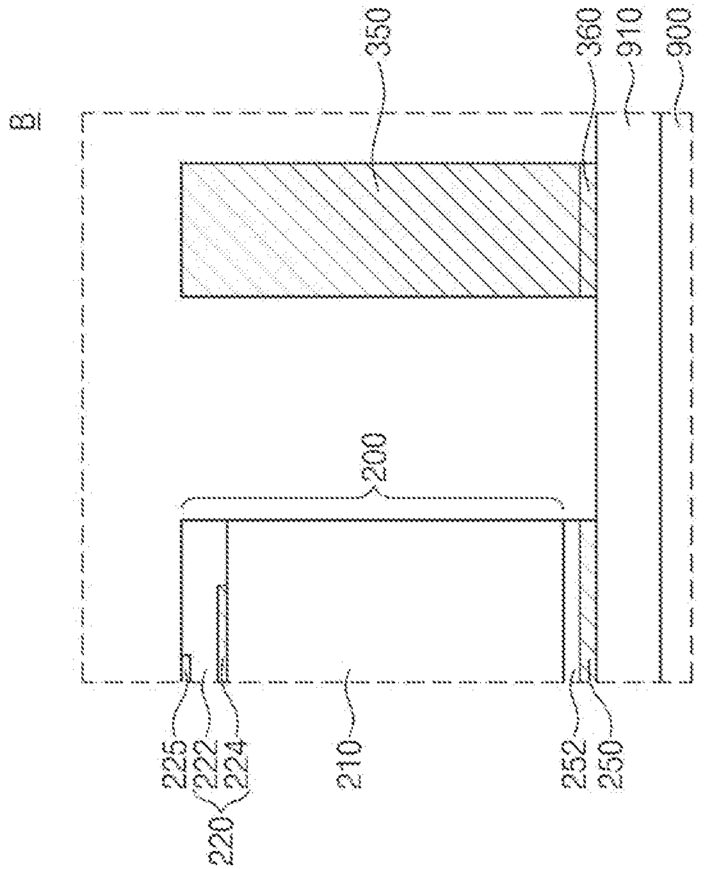

Referring to FIGS. 15A and 15B, the semiconductor chip 200 may be provided. The semiconductor chip 200 may be the semiconductor chip 200 described with reference to FIGS. 1 to 8. For example, the semiconductor chip 200 may include the chip base layer 210, the chip circuit layer 220 provided on an active surface of the chip base layer 210, and the chip adhesive layer 252 provided on an inactive surface of the chip base layer 210.

The semiconductor chip 200 may be attached to the heat-dissipation pattern 250. The semiconductor chip 200 may be attached to the heat-dissipation pattern 250 using the chip adhesive layer 252. That is, the semiconductor chip 200 may be attached to the heat-dissipation pattern 250 in a face-up manner. The planar shape of the semiconductor chip 200 may correspond to the planar shape of the heat-dissipation pattern 250. However, the disclosure is not limited to this example, and in an embodiment, the heat-dissipation pattern 250 may have the same planar shape as the semiconductor chip 200, like the embodiment of FIG. 2. As an example, a width of the heat-dissipation pattern 250 may be equal to a width of the semiconductor chip 200. Alternatively, as shown in FIG. 3, a planar shape of the heat-dissipation pattern 250 may be larger than a planar shape of the semiconductor chip 200. As an example, the width of the heat-dissipation pattern 250 may be larger than the width of the semiconductor chip 200. Alternatively, as shown in FIG. 4, the planar shape of the heat-dissipation pattern 250 may be smaller than the planar shape of the semiconductor chip 200. In an embodiment, the width of the heat-dissipation pattern 250 may be smaller than the width of the semiconductor chip 200.

Figure 16A:
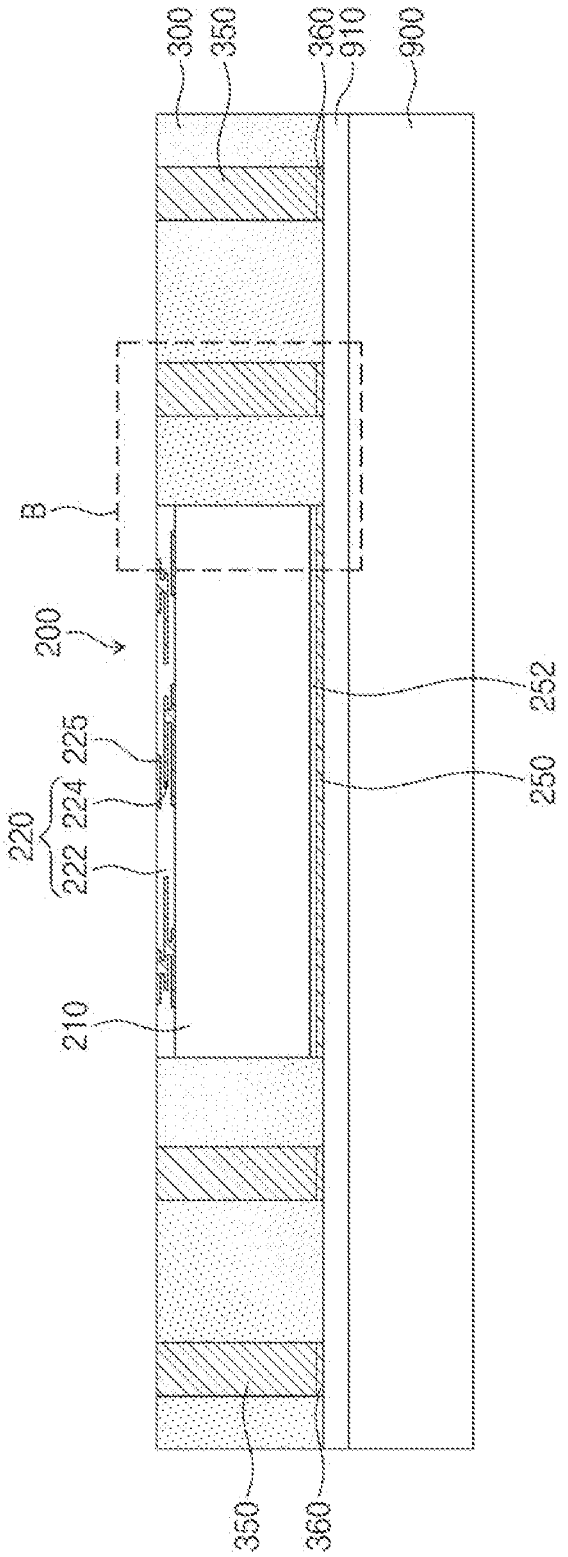
Figure 16B:
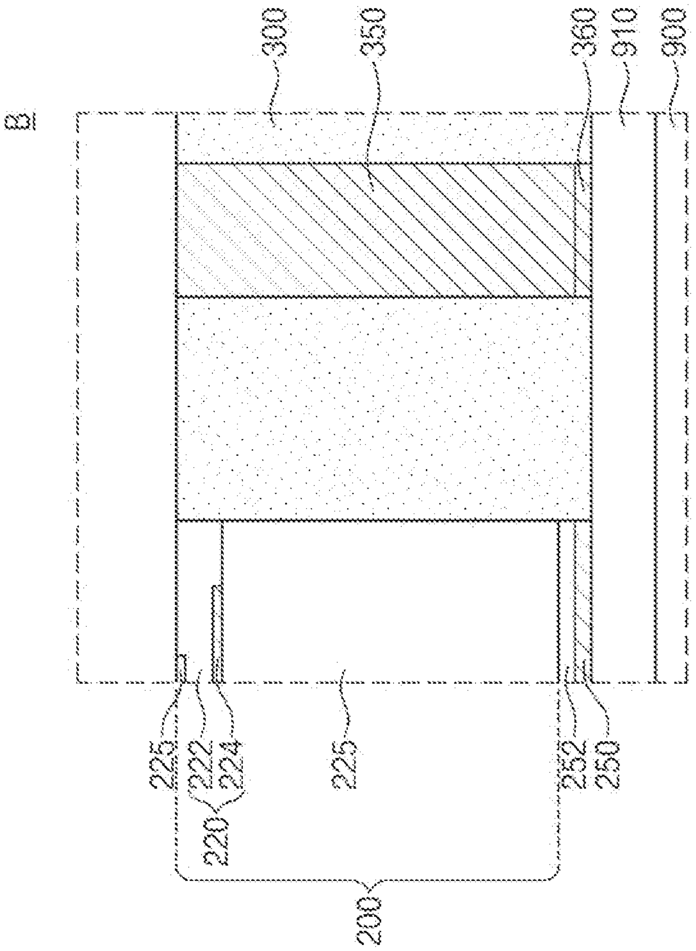

Referring to FIGS. 16A and 16B, the mold layer 300 may be formed on the insulating layer 910. For example, the mold layer 300 may be formed by coating or depositing an insulating material on the insulating layer 910. The mold layer 300 may cover the semiconductor chip 200 and the conductive posts 350.

Thereafter, a planarization process may be performed on the mold layer 300. An upper portion of the mold layer 300 may be removed by the planarization process. The planarization process may include a chemical mechanical polishing (CMP) process. The planarization process may be performed to expose the top surface of the semiconductor chip 200 and the top surfaces of the conductive posts 350. The top surface of the semiconductor chip 200 may be a top surface of the chip circuit layer 220 exposing the chip pads 225 of the semiconductor chip 200.

Figure 17A:
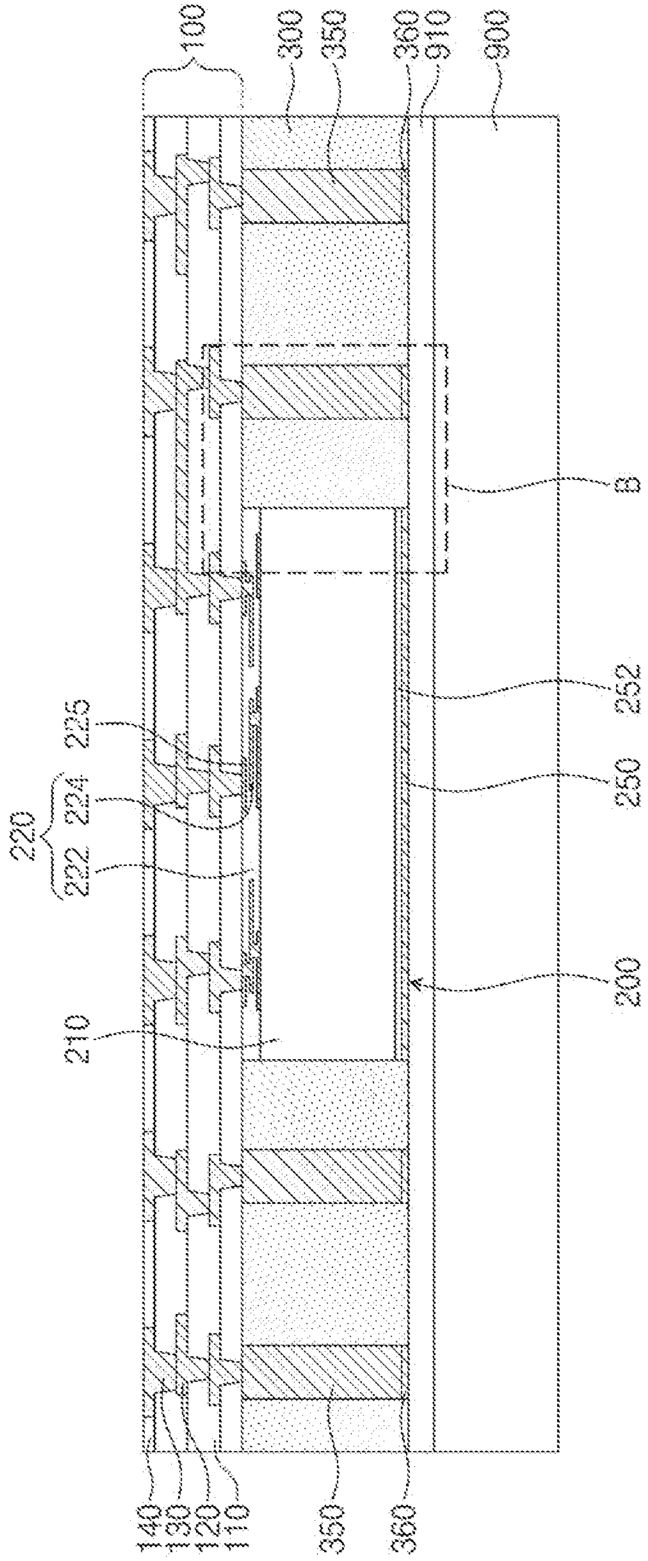
Figure 17B:
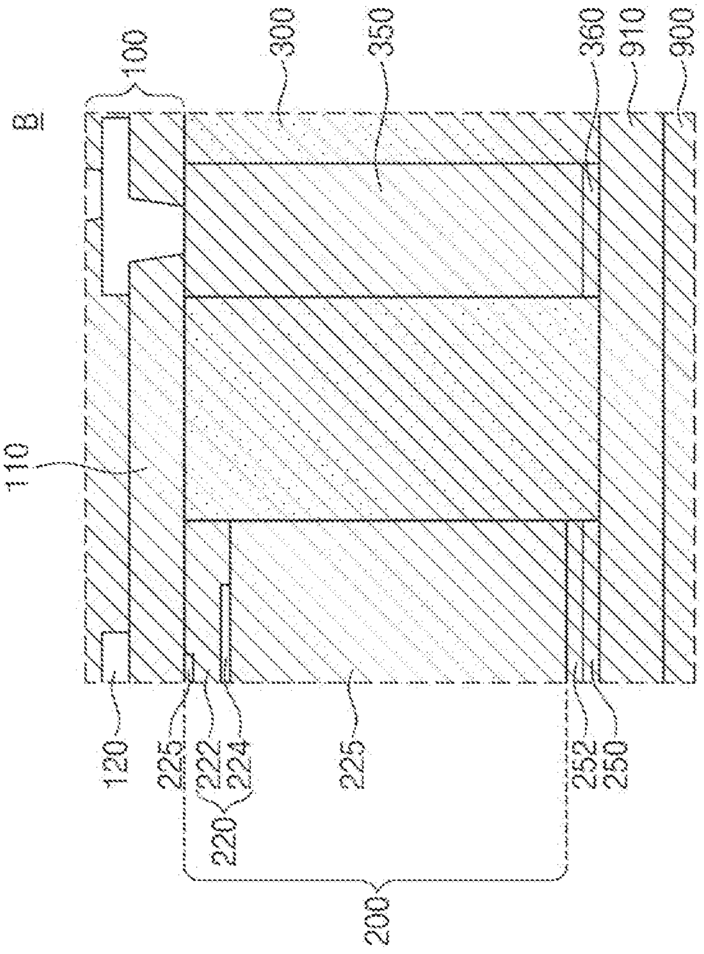

Referring to FIGS. 17A and 17B, the first redistribution substrate 100 may be formed on the mold layer 300. For example, the first substrate insulating pattern 110 may be formed by depositing an insulating material on the mold layer 300 to form an insulating layer and patterning the insulating layer to expose the conductive posts 350 and the chip pads 225, and then, the first substrate interconnection pattern 120 may be formed by forming a conductive layer on the first substrate insulating pattern 110 and patterning the conductive layer. Each of first substrate interconnection layer may be formed by the above process. The first redistribution substrate 100 may be formed by repeating the process of forming the first substrate interconnection layer.

Figure 18A:
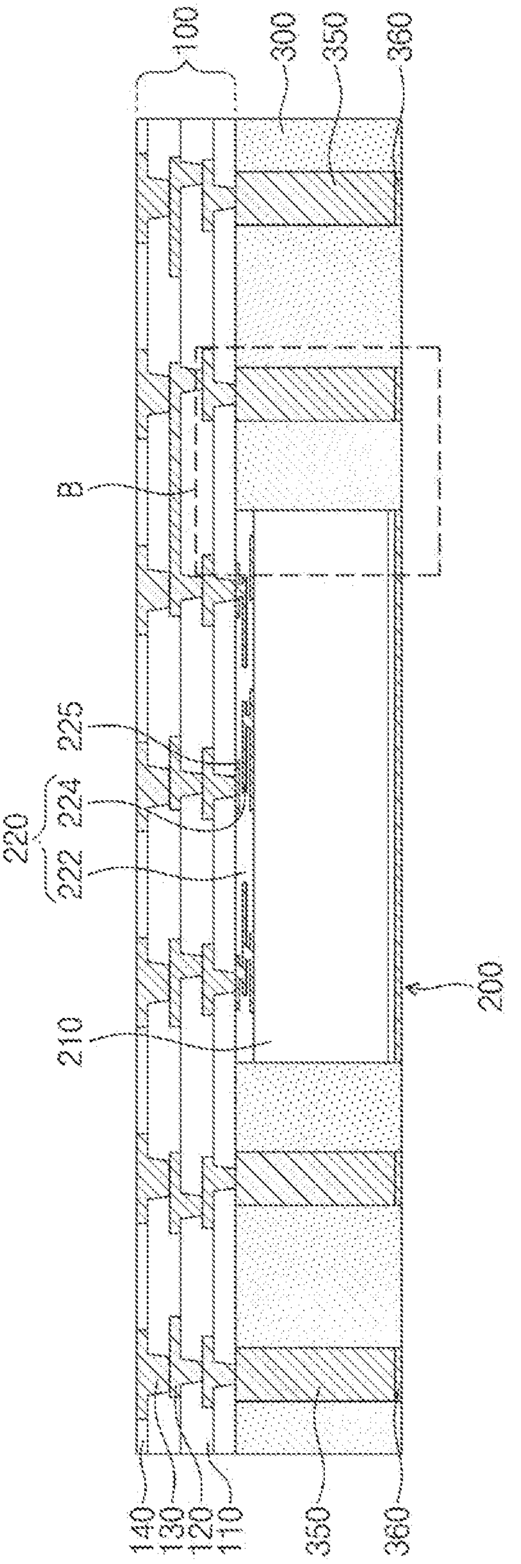
Figure 18B:
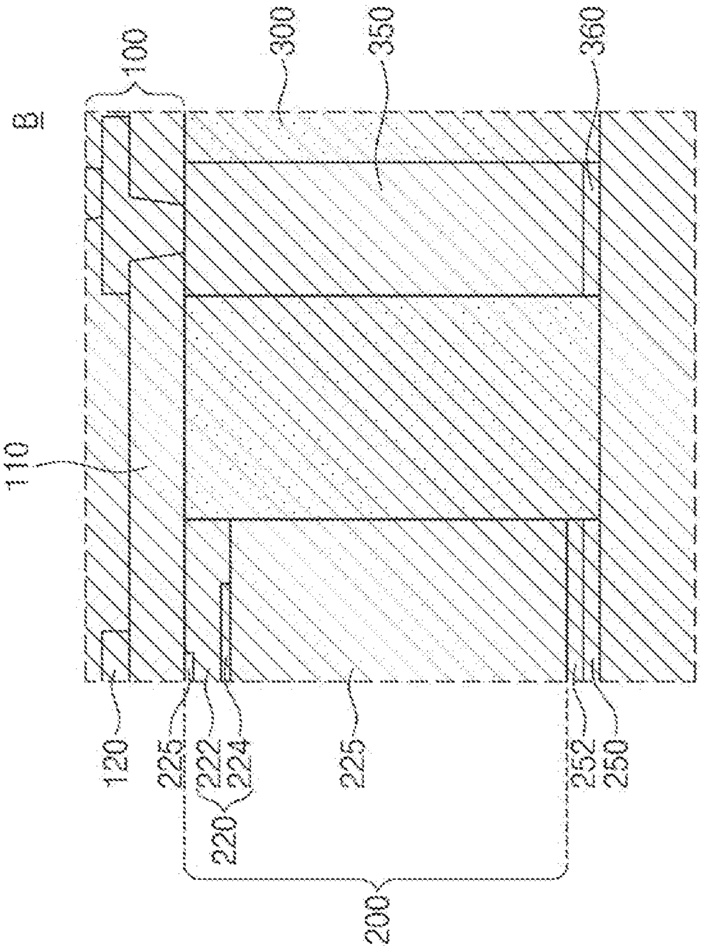

Referring to FIGS. 18A and 18B, the insulating layer 910 and the carrier substrate 900 may be removed. Thus, a bottom surface of the mold layer 300, bottom surfaces of the seed patterns 360, and a bottom surface of the heat-dissipation pattern 250 may be exposed.

Next, a structure including the first redistribution substrate 100, the semiconductor chip 200, the heat-dissipation pattern 250, the mold layer 300, the conductive posts 350, and the seed patterns 360 may be inverted. Thus, the surfaces of the mold layer 300, the seed patterns 360, and the heat-dissipation pattern 250, which are exposed by removing the insulating layer 910 and the carrier substrate 900, may become the top surfaces of the mold layer 300, the seed patterns 360, and the heat-dissipation pattern 250.

Referring back to FIG. 1, the second redistribution substrate 400 may be formed on the mold layer 300. For example, the second substrate insulating pattern 410 may be formed by depositing an insulating material on the mold layer 300 to form an insulating layer and patterning the insulating layer to expose the conductive posts 350 and the heat-dissipation pattern 250, and then, the second substrate interconnection pattern 420 may be formed by forming a conductive layer on the second substrate insulating pattern 410 and patterning the conductive layer. Each of second substrate interconnection layer may be formed by the above process. The second redistribution substrate 400 may be formed by repeating the process of forming the second substrate interconnection layer. A portion of the second substrate interconnection pattern 420 coupled to the heat-dissipation pattern 250 may be the heat transfer pattern 422.

The outer terminals 150 may be provided on the substrate pads 130 of the first redistribution substrate 100.

As a result of the afore-described fabrication process, the semiconductor package may be fabricated to have the structure of FIG. 1.

FIGS. 10A to 18A and FIGS. 10B to 18B illustrate an example in which the first and second redistribution substrates 100 and 400 are formed after the formation of the semiconductor chip 200, the heat-dissipation pattern 250, the mold layer 300, the conductive posts 350, and the seed patterns 360 on the carrier substrate 900, but the disclosure is not limited to this example.

In an embodiment, the second redistribution substrate 400 may be formed, and then the semiconductor chip 200, the heat-dissipation pattern 250, the mold layer 300, the conductive posts 350, and the seed patterns 360 may be formed. For example, the second redistribution substrate 400 may be formed on the carrier substrate 900. The second substrate insulating pattern 410 may be formed by depositing an insulating material on the carrier substrate 900 to form an insulating layer and patterning the insulating layer, the second substrate interconnection pattern 420 may be formed by forming a conductive layer on the second substrate insulating pattern 410 and patterning the conductive layer, and in this case, the second substrate insulating pattern 410 and the second substrate interconnection pattern 420 may form one second substrate interconnection layer. The second redistribution substrate 400 may be formed by repeating the process of forming the second substrate interconnection layer. The insulating layer 910 may be formed on the second redistribution substrate 400 to expose the second substrate interconnection pattern 420, the seed layer 920 and the conductive posts 350 on the seed layer 920 may be formed, and a laser irradiation process may be performed to form the seed patterns 360 and the heat-dissipation pattern 250. The semiconductor chip 200 may be attached to the heat-dissipation pattern 250, and the mold layer 300 may be formed on the second redistribution substrate 400. The first redistribution substrate 100 may be formed on the mold layer 300, and the outer terminals 150 may be attached to the first redistribution substrate 100. Thereafter, the carrier substrate 900 may be removed.

In a semiconductor package according to an embodiment of the disclosure, an outer side surface of a seed pattern may be coplanar with an outer side surface of a conductive post. That is, the seed pattern may be formed without an under-cut region, which is laterally recessed from the outer side surface of the conductive post. Thus, it may be possible to prevent the conductive posts from being detached from a second redistribution substrate or the seed patterns by the under-cut region and thereby improve the structural stability of the semiconductor package. In addition, the seed patterns may have substantially the same planar shape as the conductive posts. That is, the seed patterns may be provided to have a large area, without the under-cut region, and thus, a contact area between the seed patterns and the conductive posts may be increased. Accordingly, an electric resistance or an interface resistance between the conductive posts and the seed patterns may be lowered, and this may make it possible to improve the electrical characteristics of the semiconductor package.

In addition, a heat-dissipation pattern may be provided on a rear surface of a semiconductor chip, and a second substrate interconnection pattern of the second redistribution substrate placed on the rear surface of the semiconductor chip may be used as a heat transfer pattern for exhausting heat. Accordingly, the heat-dissipation efficiency of the semiconductor package may be improved.

In a method of fabricating a semiconductor package according to an embodiment of the disclosure, a laser irradiation process may be performed to pattern the seed layer, but not the conductive posts, even without using an additional mask pattern. Furthermore, of the seed pattern and the conductive post may be formed to have outer side surfaces that are coplanar with each other and form a flat surface. That is, the under-cut region may not be formed in the seed pattern. Thus, it may be possible to prevent an adhesive strength between the seed patterns and the conductive posts or between the seed patterns and an insulating layer from being weakened by the under-cut region and thereby preventing the conductive posts from being detached from the insulating layer. Furthermore, in the case where the conductive post is thick, the conductive post may not be etched by a laser, and thus, the conductive post may not be deformed during a process of patterning the seed layer. That is, it may be possible to reduce a failure rate in a process of fabricating a semiconductor package.

While example embodiments of the disclosure have been particularly shown and described, it will be understood by one of ordinary skill in the art that variations in form and detail may be made therein without departing from the spirit and scope of the attached claims.

What is claimed is:

1. A method of fabricating a semiconductor package, the method comprising:

providing an insulating layer;

forming a seed layer to cover a top surface of the insulating layer;

forming a sacrificial layer on the seed layer;

forming penetration holes to penetrate the sacrificial layer and expose the seed layer;

forming conductive posts in the penetration holes;

removing the sacrificial layer;

performing a laser irradiation process on the seed layer to form seed patterns below the conductive posts;

attaching a semiconductor chip to a portion of the insulating layer located between the conductive posts; and removing the insulating layer, wherein an outer side surface of the conductive posts and an outer side surface of the seed patterns are substantially coplanar with each other, thereby forming a substantially flat surface.

2. The method of claim 1, wherein the laser irradiation process is performed with an excimer laser.

3. The method of claim 2, wherein the laser irradiation process comprises directly exposing the conductive posts and the seed layer to the excimer laser, wherein the conductive posts are not etched by the laser irradiation process, and wherein the seed layer is etched by the laser irradiation process.

4. The method of claim 1, wherein the laser irradiation process forms a heat-dissipation pattern between the conductive posts on a portion of the seed layer left unetched by the laser irradiation process.

5. The method of claim 4, wherein the portion of the seed layer left unetched by the laser irradiation process is not exposed to a laser during the laser irradiation process.

6. The method of claim 4, wherein the semiconductor chip is attached to the heat-dissipation pattern.

7. The method of claim 1, wherein a thickness and a width of the conductive posts range from 1 μm to 1 mm, and a thickness of the seed layer ranges from 1 nm to 900 nm.

8. The method of claim 1, wherein the insulating layer comprises a photoresist material.

9. The method of claim 8, wherein the insulating layer comprises at least one of polyimide (PI) or polyimide-based polymers.

10. The method of claim 1, wherein the seed layer and the conductive posts are formed of copper-containing materials.

* * * * *